United States Patent
Lee et al.

(10) Patent No.: US 9,202,849 B2
(45) Date of Patent: Dec. 1, 2015

(54) THIN FILM SEMICONDUCTOR DEVICE AND ORGANIC LIGHT-EMITTING DISPLAY DEVICE

(71) Applicant: Samsung Display Co., Ltd., Yongin, Gyeonggi-Do (KR)

(72) Inventors: Seung-Chan Lee, Yongin (KR); Jong-Ho Hong, Yongin (KR); Jong-In Baek, Yongin (KR); Won-Sang Park, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 31 days.

(21) Appl. No.: 13/972,674

(22) Filed: Aug. 21, 2013

(65) Prior Publication Data

US 2014/0306191 A1    Oct. 16, 2014

(30) Foreign Application Priority Data

Apr. 12, 2013 (KR) .................. 10-2013-0040548

(51) Int. Cl.
*H01L 27/32* (2006.01)
*H01L 29/786* (2006.01)
*H01L 29/417* (2006.01)

(52) U.S. Cl.
CPC ...... *H01L 27/3225* (2013.01); *H01L 29/41733* (2013.01); *H01L 29/78618* (2013.01); *H01L 29/78669* (2013.01); *H01L 29/78678* (2013.01)

(58) Field of Classification Search
CPC .................. H01L 27/3225; H01L 29/78669; H01L 29/78678

USPC .............................. 257/366, E29.12
See application file for complete search history.

(56) References Cited

U.S. PATENT DOCUMENTS

| 5,483,082 | A | | 1/1996 | Takizawa et al. |
| 5,497,028 | A | * | 3/1996 | Ikeda et al. .................. 257/531 |
| 5,500,552 | A | * | 3/1996 | Ikeda et al. .................. 257/531 |
| 5,525,813 | A | * | 6/1996 | Miyake et al. .................. 257/59 |
| 5,808,318 | A | * | 9/1998 | Masumo et al. ................. 257/66 |
| 5,977,562 | A | * | 11/1999 | Hirakata et al. ................ 257/72 |

(Continued)

FOREIGN PATENT DOCUMENTS

| CN | 102800692 A | 11/2012 |
| EP | 1562240 A2 | 8/2005 |

(Continued)

OTHER PUBLICATIONS

Extended European Search Report issued on Jul. 4, 2014 by EPO in connection with corresponding European Patent Application No. 13192481.3.

*Primary Examiner* — Earl Taylor
(74) *Attorney, Agent, or Firm* — Robert E. Bushnell, Esq.

(57) ABSTRACT

A thin film semiconductor device including a thin film transistor (TFT) that maintains a constant electrical characteristic and an organic light-emitting display device. The thin film semiconductor device includes: a substrate; and a thin film transistor (TFT) disposed on the substrate and comprising a semiconductor layer comprising a source region and a drain region, wherein a part of the source region is spaced apart from the drain region and partially surrounds the drain region, and wherein a part of the drain region is spaced apart from the source region and partially surrounds the source region.

20 Claims, 11 Drawing Sheets

(56) References Cited

U.S. PATENT DOCUMENTS

| | | | | |
|---|---|---|---|---|
| 6,157,048 | A * | 12/2000 | Powell | 257/59 |
| 6,545,291 | B1 * | 4/2003 | Amundson et al. | 257/40 |
| 6,639,281 | B2 * | 10/2003 | Kane et al. | 257/350 |
| 7,342,288 | B2 * | 3/2008 | Fujii et al. | 257/401 |
| 8,912,094 | B2 * | 12/2014 | Koo et al. | 438/666 |
| 2002/0128515 | A1 * | 9/2002 | Ishida et al. | 564/435 |
| 2005/0127357 | A1 * | 6/2005 | Wong et al. | 257/59 |
| 2005/0128409 | A1 * | 6/2005 | Lee | 349/141 |
| 2005/0173701 | A1 * | 8/2005 | Kawase et al. | 257/40 |
| 2007/0187685 | A1 * | 8/2007 | Tu | 257/72 |
| 2007/0254456 | A1 * | 11/2007 | Maruyama et al. | 438/458 |
| 2008/0169462 | A1 * | 7/2008 | Nakamura et al. | 257/40 |
| 2011/0215411 | A1 * | 9/2011 | John et al. | 257/365 |
| 2011/0284837 | A1 | 11/2011 | Nishijima | |
| 2013/0009218 | A1 * | 1/2013 | Chen et al. | 257/288 |
| 2013/0041235 | A1 * | 2/2013 | Rogers et al. | 600/306 |
| 2014/0134840 | A1 * | 5/2014 | Koo et al. | 438/666 |
| 2014/0160391 | A1 * | 6/2014 | Morimoto et al. | 349/46 |
| 2014/0306191 | A1 * | 10/2014 | Lee et al. | 257/40 |

FOREIGN PATENT DOCUMENTS

| | | |
|---|---|---|
| KR | 10-2008-0039179 A | 5/2008 |
| KR | 10-2009-0039216 A | 4/2009 |
| KR | 10-2012-0070709 A | 7/2012 |
| WO | 0008689 A1 | 2/2000 |
| WO | 2014023013 A1 | 2/2014 |

* cited by examiner

THIN FILM SEMICONDUCTOR DEVICE AND ORGANIC LIGHT-EMITTING DISPLAY DEVICE

CLAIM OF PRIORITY

This application makes reference to, incorporates the same herein, and claims all benefits accruing under 35 U.S.C. §119 from an application earlier filed in the Korean Intellectual Property Office on Apr. 12, 2013 and there duly assigned Serial No. 10-2013-0040548.

BACKGROUND OF THE INVENTION

1. Field of the Invention

The present invention relates to a thin film semiconductor device including a thin film transistor (TFT) and an organic light-emitting display device, and more particularly, to a thin film semiconductor device including a TFT that maintains a constant electrical characteristic and an organic light-emitting display device.

2. Description of the Related Art

Recently, a display device has been settled as an important device among electronic products. The display device becomes smaller so as to make it easy to carry electronic products. There is a limit to the small sized display device such that demands of diverse users cannot be met. Thus, research into a flexible display device including a rollable or foldable flexible panel has been recently conducted.

When the flexible panel is rolled or folded, the flexible panel elongates in a rolling or folding direction and contracts in a direction perpendicular to the rolling or folding direction. As a result, physical numerical values of a channel length and a channel width of a thin film transistor (TFT) or the flexible panel may vary, and an electrical characteristic of a drain current of the TFT may vary.

SUMMARY OF THE INVENTION

The present invention provides a thin film semiconductor device including a thin film transistor (TFT) that maintains a constant electrical characteristic and an organic light-emitting display device.

According to an aspect of the present invention, there is provided a thin film semiconductor device including: a flexible substrate; and a thin film transistor (TFT) disposed on the substrate and including a semiconductor layer including a source region and a drain region, wherein a part of the source region is spaced apart from the drain region and partially surrounds the drain region, and wherein a part of the drain region is spaced apart from the source region and partially surrounds the source region.

The source region and the drain region may have spiral shapes.

The source region and the drain region may have line shapes including a first edge closer to the center of the TFT and a second edge farther from the center of the TFT, respectively, and include a first arc portion closer to the first edge and having a first curvature radius and a second arc portion closer to the second edge and having a second curvature radius greater than the first curvature radius, respectively.

The curvature radius of the second arc portion may be 2 times the curvature radius of the first arc portion.

The source region and the drain region have may include a first rectilinear portion extending from the first edge to one end of the first arc portion and a second rectilinear portion extending from another end of the first arc portion to an opposite direction to a direction in which the first rectilinear portion extends and having the same length as the first rectilinear portion, respectively, wherein the second rectilinear portion of the source region, the first rectilinear portion of the drain region, the first rectilinear portion of the source region, and the second rectilinear portion of the drain region are sequentially and equally spaced apart from each other.

The source region and the drain region may have rectangular spiral shapes.

The source region and the drain region may have line shapes including a first edge closer to the center of the TFT and a second edge farther from the center of the TFT, respectively, and include a first portion extending from the first edge, a second portion connected to the first portion and extending in a direction perpendicular to a direction in which the first portion extends, a third portion connected to the second portion and extending in an opposite to the direction in which the first portion extends, and a fourth portion connected to the third portion and extending in an opposite to a direction in which the second portion extends, respectively.

A length of the first portion may be shorter than a length of the third portion.

The source region and the drain region may be rotational and symmetrical to each other.

The semiconductor layer may include a channel region defined as a region between the source region and the drain region, wherein the channel region includes a channel length defined as a distance between the source region and the drain region and a channel width defined along a direction perpendicular to the channel length.

The substrate may extend in a first direction and a second direction perpendicular to the first direction, wherein the channel region includes a plurality of first portions having channel lengths perpendicular to the first direction and a plurality of second portions having channel lengths in a direction perpendicular to the second direction.

The channel lengths may be uniform in a direction of the channel width.

The substrate and the semiconductor layer may be elongatable.

When the substrate elongates in the first direction, the channel lengths of the plurality of first portions of the channel region decrease, and the channel lengths of the plurality of second portions of the channel region increase, and wherein when the substrate elongates in the second direction, the channel lengths of the plurality of second portions of the channel region decrease, and the channel lengths of the plurality of first portions of the channel region increase.

The TFT may further include a bottom gate electrode disposed between the substrate and the channel region of the semiconductor layer.

The TFT may further include a top gate electrode disposed on the channel region of the semiconductor layer.

The TFT may further include a bottom gate electrode disposed between the substrate and the channel region of the semiconductor layer and a top gate electrode disposed on the channel region of the semiconductor layer.

The bottom gate electrode and the top gate electrode may be electrically connected to each other and have a same electric potential.

The TFT may further include a source electrode electrically connected to the source region through a first contact plug and a drain electrode electrically connected to the drain region through a second contact plug.

The TFT may further include a source electrode connected to the source region and a drain electrode connected to the drain region, and wherein the source electrode and the drain electrode are disposed to contact the semiconductor layer on a top surface of the semiconductor layer along the semiconductor layer and define the source region and the drain region, respectively.

The TFT may further include a source electrode connected to the source region and a drain electrode connected to the drain region, and wherein the source electrode and the drain electrode are disposed to contact the semiconductor layer on a bottom surface of the semiconductor layer along the semiconductor layer and define the source region and the drain region, respectively.

The semiconductor layer may include at least one silicon semiconductor, an oxide semiconductor, and an organic semiconductor.

According to another aspect of the present invention, there is provided an organic light-emitting display device including: a substrate; a thin film transistor (TFT) disposed on the substrate and including a semiconductor layer including a source region and a drain region having spiral shapes; a bottom electrode electrically connected to the TFT; a top electrode provided on the bottom electrode; and an emission layer (EML) disposed between the bottom electrode and the top electrode and including an organic emission layer.

A part of the source region may be spaced apart from the drain region and partially surrounds the drain region, and wherein a part of the drain region is spaced apart from the source region and partially surrounds the source region.

The source region and the drain region may be rotational and symmetrical to each other.

to another aspect of the present invention, there is provided a thin film semiconductor device including: a flexible substrate extending in a first direction and a second direction perpendicular to the first direction; a semiconductor layer disposed on the flexible substrate, including first and second surfaces facing each other, and a channel region; a source electrode and a drain electrode provided on the first surface or the second surface of the semiconductor layer and disposed at both sides of the channel region along the channel region of the semiconductor layer; and a gate electrode provided on the first surface or the second surface of the semiconductor layer, spaced apart from the semiconductor layer and overlapping with at least a part of the semiconductor layer, wherein the channel region includes a channel length defined as a distance between the source region and the drain region, a plurality of first portions having channel lengths perpendicular to the first direction, and a plurality of second portions having channel lengths in a direction perpendicular to the second direction.

When the flexible substrate elongates in the first direction, the channel lengths of the plurality of first portions of the channel region may decrease, and the channel lengths of the plurality of second portions of the channel region may increase, and when the flexible substrate elongates in the second direction, the channel lengths of the plurality of second portions of the channel region may decrease, and the channel lengths of the plurality of first portions of the channel region may increase.

When the flexible substrate elongates, a change rate of size of the semiconductor layer according to an elongation direction may be higher than that of an average channel length of the channel region.

The channel region may be 180 degree rotational and symmetrical.

According to another aspect of the present invention, there is provided an organic light-emitting display device including: a flexible substrate extending in a first direction and a second direction perpendicular to the first direction; a TFT disposed on the flexible substrate; a bottom electrode electrically connected to the TFT; a top electrode provided on the bottom electrode; and an emission layer (EML) disposed between the bottom electrode and the top electrode and including an organic emission layer, wherein the TFT includes: a semiconductor layer including a channel region including a channel length and a channel width; a source electrode and a drain electrode provided on the semiconductor layer and spaced apart from each other by the channel length at both sides of the channel region along the channel width; and a gate electrode overlapping with the channel region of the semiconductor layer, wherein the channel region includes a channel length defined as a distance between the source region and the drain region, a plurality of first portions having channel lengths perpendicular to the first direction, and a plurality of second portions having channel lengths in a direction perpendicular to the second direction.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
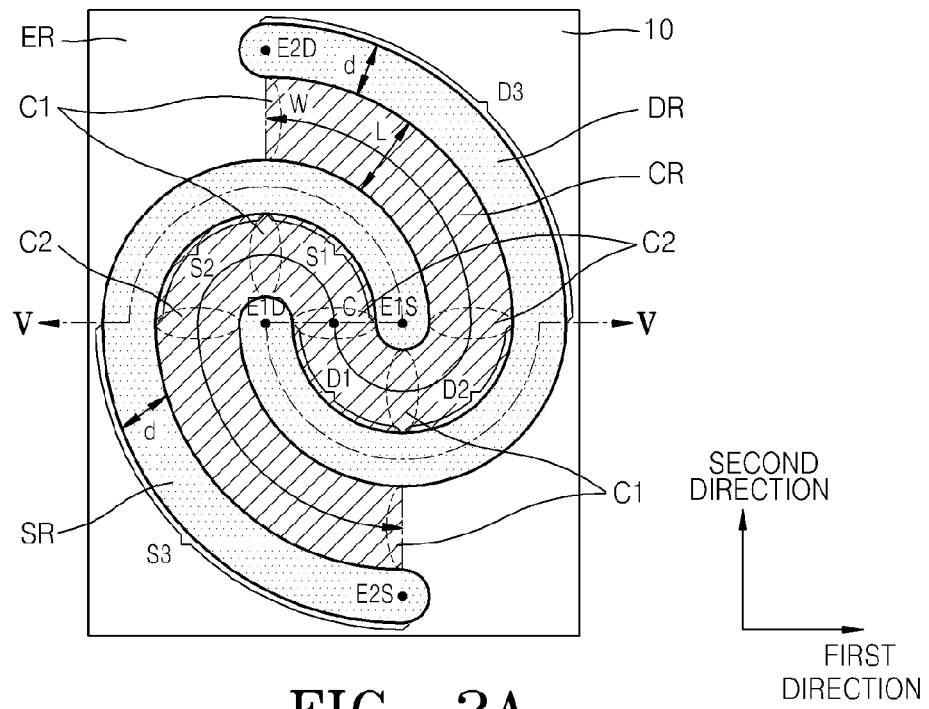
FIG. 1 is a schematic top plan view illustrating a semiconductor layer of a thin film semiconductor device according to an embodiment of the present invention.

The present invention will now be described more fully with reference to the accompanying drawings, in which exemplary embodiments of the invention are shown. The invention may, however, be embodied in many different forms, and should not be construed as being limited to the embodiments set forth herein. Thus, the invention may include all revisions, equivalents, or substitutions which are included in the concept and the technical scope related to the invention.

Like reference numerals in the drawings denote like elements. In the drawings, the dimension of structures may be exaggerated for clarity.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof. As used herein, the term "and/or" includes any and all combinations of one or more of the associated listed items. Throughout the specification, while terms "first" and "second" are used to describe various components, it is obvious that the components are not limited to the terms "first" and "second". The terms "first" and "second" are used only to distinguish between each component. As used herein, it will also be understood that when a first feature is referred to as being "connected to", "combined with", or "interfaced with" a second feature, intervening third features may also be present. Also, throughout the specification, it will also be understood that when an element such as layer, region, or substrate is referred to as being "on", "connected to" or "coupled with" another element, it can be directly on the other element, or intervening elements may also be present. However, when an element is referred to as being "directly on", "directly connected to" or "directly coupled with" another element, it will be understood that there are no intervening elements.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

FIG. 1 is a schematic top plan view illustrating a semiconductor layer 10 of a thin film semiconductor device according to an embodiment of the present invention.

Referring to FIG. 1, the semiconductor layer 10 includes a source region SR, a drain region DR, and a channel region CR between the source region SR and the drain region DR. Although the semiconductor layer 10 in a thin film is stacked on a substrate (not shown) and is coupled to other elements such as a buffer layer, a source electrode, a drain electrode, a gate electrode, a gate insulation layer, etc., the semiconductor layer 10 is only illustrated while omitting the other elements for easy understanding of the present invention. The semiconductor layer 10 may be referred to as an active layer.

The semiconductor layer 10 may include an element semiconductor material including a 4 group element such as silicone, germanium, etc. For example, the semiconductor layer 10 may be a silicon material layer such as amorphous silicon or polysilicon. The semiconductor layer 10 may be lightly doped with a 3 group element or 5 group element. The source region SR and the drain region DR may be conductive as being heavily doped with the 3 group element or 5 group element.

The semiconductor layer 10 may include compound semiconductor, in particular, oxide semiconductor. For example, the semiconductor layer 10 may be an oxide semiconductor layer. The oxide semiconductor may include oxide of at least one material selected from the group consisting of indium (In), gallium (Ga), stannum (Sn), zirconium (Zr), vanadium (V), hafnium (Hf), cadmium (Cd), germanium (Gr), chrome (Cr), titanium (Ti), and zinc (Zn). For example, the oxide semiconductor may include gallium (Ga), indium (In), and zinc (Zn) at an element percent (atom %) ratio of 2:2:1. However, the present invention is not limited thereto. The oxide semiconductor may be formed of a quaternary metal oxide such as In—Sn—Ga—Zn—O-based metal oxide, a ternary metal oxide such as In—Ga—Zn—O-based metal oxide, In—Sn—Zn—O-based metal oxide, In—Al—Zn—O-based metal oxide, Sn—Ga—Zn—O-based metal oxide, and Al—Ga—Zn—O-based metal oxide, a binary metal oxide such as In—Zn—O-based metal oxide, Sn—Zn—O-based metal oxide, Al—Zn—O-based metal oxide, Zn—Mg—O-based metal oxide, Sn—Mg—O-based metal oxide, and In—Mg—O-based metal oxide, or a unitary metal oxide such as In—O-based metal oxide, Sn—O-based metal oxide, Zn—O-based metal oxide, Ti—O-based metal oxide, and Cd—O-based metal oxide. In this regard, the In—Ga—Zn—O-based metal oxide may be oxide including at least In, Ga, and Zn, and a composition ratio is not particularly limited. Also, the In—Ga—Zn—O-based metal oxide may include elements other than In, Ga, and Zn.

A thin film transistor (TFT) having the oxide semiconductor as the semiconductor layer 10 has a characteristic of a high mobility compared to a conventional silicon (Si) TFT and thus ion doping for an increase in the mobility may not be separately performed. Also, an oxide semiconductor TFT has a polycrystal and amorphous structure at a room temperature, and thus an annealing process may be skipped and accordingly it is possible to manufacture the oxide semiconductor TFT at a low temperature. Also, the semiconductor layer 10 may be formed by sputtering, and thus oxide semiconductor TFT may be applied to a large area substrate and advantageously uses an inexpensive material.

The semiconductor layer 10 may an organic semiconductor. For example, the semiconductor layer 10 may be an organic semiconductor layer. The organic semiconductor may be a high molecular semiconductor or a low molecular semiconductor. For example, the organic semiconductor may be formed of pentacene, tetracene, anthracene, naphthalene, flullerene, alpha-6-thiophene, alpha-4-thiophene, oligo thiophene, perylene and its derivatives, rubrene and its derivatives, coronene and its derivatives, perylenetetra carboxylic diimide and its derivatives, perylene tetra carboxylic dianhydride and its derivatives, polythiophene and its derivatives, poly-para-phenylene vinylene and its derivatives, poly-para-phenylene and its derivatives, polyflullerene poly-para-phenylene vinylene and its derivatives, polythiophene vinylene and its derivatives, polythiophene-heterocyclic aromatic copolymer and its derivatives, oligoacene of naphthalene and their derivatives, naphthalene tetra carboxylic acid diimide and its derivatives, oligo thiophene of alpha-5-thiophene and their derivatives, metal or metal free phthalocyanines and their derivatives, pyromellitic dianhydride and their derivatives, pyromellitic diimide and their derivatives, polyalkylthiophene, polythienylenevinylene, alkylfluorene unit, copolymer of alkylthiophene. However, these materials are exemplary and other organic semiconductors may be employed as materials of the semiconductor layer 10. In this regard, the semiconductor layer 10 may be formed by screen printing, printing, spin coating, deep coating, and ink spraying but the present invention is not limited thereto. When the semiconductor layer 10 is the organic semiconductor layer, the semiconductor layer 10 may include a predetermine functional group. A function and characteristic of the semiconductor layer 10 may be modified in various ways according to a type of the functional group.

The semiconductor layer 10 may be flexible. In addition, the semiconductor layer 10 extending in a first direction and a second direction perpendicular to the first direction may elongate in one direction. In this regard, the first direction is not limited to a horizontal direction or a vertical direction of the semiconductor layer 10 and may be an optional direction. For example, when a tensile force of the first direction is applied to the semiconductor layer 10, since a contraction force is applied to the second direction perpendicular to the first direction, the semiconductor layer 10 may elongate in the first direction and contract in the second direction.

When a conventional semiconductor layer elongates in the first direction and contracts in the second direction, a characteristic of a TFT including the conventional semiconductor layer varies. A drain current that is a core characteristic of the TFT is known to be proportional to an aspect ratio. The aspect ratio means a ratio of a channel width W with respect to a channel length L. When the channel length L is defined in the first direction and the channel width W is defined in the second direction, if the conventional semiconductor layer elongates in the first direction, a problem occurs that the aspect ratio of the TFT may be greatly reduced and the drain current may be also reduced. To the contrary, if the conventional semiconductor layer elongates in the second direction, a problem also occurs that the aspect ratio of the TFT may be greatly increased and the drain current may be also increased.

The semiconductor layer 10 of the thin film semiconductor device according to the present embodiment may include the source region SR and drain region DR in a spiral shape as shown in FIG. 1. Also, the semiconductor layer 10 may include the channel region CR defined as a region between the source region SR and drain region DR. The channel region CR is a region in which a channel is formed by inverting a conductivity type between the source region SR and drain region DR if an electrical field is applied by a gate electrode (not shown) that at least partially overlaps with the channel region CR. The source region SR and drain region DR may be switched according to a circuit configuration. That is, the source region SR may be used as a drain and the drain region DR may be used as a source.

Although the semiconductor layer 10 further includes an edge region ER that does not belong to the source region SR, the drain region DR, and the channel region CR in FIG. 1, the edge region ER may be omitted according to patterning of the semiconductor layer 10. The edge region ER may be defined as a region in which no channel is formed although the electrical field is applied. A boundary between the source region SR and drain region DR is indicated as a dotted line in FIG. 1 since it is not clear. For example, when an intensity of the electrical field applied to the gate electrode increases, a channel may be formed in a part of the edge region ER adjacent to the channel region CR.

As shown in FIG. 1, the source region SR and drain region DR may be disposed in the spiral shape. The source region SR and drain region DR may be spaced from each other within a predetermined range. The source region SR and drain region DR are spaced apart from each other by a first distance L in FIG. 1. The first distance L may be referred to as the channel length L.

As shown in FIG. 1, a spaced distance between the source region SR and drain region DR may be uniform. The spaced distance between the source region SR and drain region DR may slightly differ according to a plane phenomenon between the source region SR and drain region DR. However, a maximum spaced distance between the source region SR and drain region DR may not exceed 1.5 times a minimum spaced distance therebetween. For example, when the source region SR and drain region DR are not curved shapes but are rectilinear shapes meeting at right angles, the maximum spaced distance may be 2.5 times the minimum spaced distance.

The source region SR and drain region DR may be line shapes including first edges E1S and E1D and second edges E2S and E2D. When a center of the semiconductor layer 10 is indicated as a center point C, the first edges E1S and E1D may be defined as edges adjacent to the center point C and the second edges E2S and E2D may be defined as edges far from the center point C. The source region SR and drain region DR are line shapes and thus a length direction and a width direction perpendicular to the length direction may be defined. The source region SR and drain region DR may have thicknesses d in a uniform width direction.

For convenience of explanation, the source region SR may be divided into a first portion S1, a second portion S2, and a third portion S3 between the first edge E1S and the second edge E2S. The first portion S1 may be a portion adjacent to the first edge E1S. The third portion S3 may be a portion adjacent to the second edge E2S. The drain region DR may also be divided into a first portion D1, a second portion D2, and a third portion D3 between the first edge E1D and the second edge E2D. The first portion D1 may be a portion adjacent to the first edge E1D. The third portion D3 may be a portion adjacent to the second edge E2D.

As shown in FIG. 1, a part of the source region SR may partially surround the drain region DR. More specifically, the third portion S3 of the source region SR may surround the first portion D1 of the drain region DR with respect to the first edge E1S of the source region SR.

A part of the drain region DR may partially surround the source region SR. More specifically, the third portion D3 of the drain region DR may surround the first portion S1 of the source region SR with respect to the first edge E1D of the drain region DR.

The first portion S1 and the second portion S2 of the source region SR may be referred to as a first arc portion. Also, the third portion S3 of the source region SR may be referred to as a second arc portion. As shown in FIG. 1, a curvature radius of the second arc portion may be greater than that of the first arc portion since the second arc portion needs to surround a part of the drain region DR.

More specifically, the source region's first arc portion may be a part of a circumference with respect to the first edge E1D of the drain region DR. The curvature radius of the first arc portion may be a distance L+d between the first edge E1D of the drain region DR and the first edge E1S of the source region SR. The second arc portion may be a part of a circumference with respect to the first edge E1S of the source region SR. The curvature radius of the second arc portion may be a distance 2L+2d between the first edge E1S of the source region SR and the second edge E2D of the drain region DR. The curvature radius of the second arc portion may be 2 times the curvature radius of the first arc portion.

The drain region DR may have the same shape as the source region SR. The first portion D1 and the second portion D2 of the drain region DR may be referred to as the first arc portion. The third portion D3 of the drain region DR may be referred to as the second arc portion. As shown in FIG. 1, the curvature radius of the second arc portion may be greater than that of the first arc portion since the second arc portion needs to surround a part of the source region SR.

More specifically, the drain region's first arc portion may be a part of a circumference with respect to the first edge E1S of the source region SR. The curvature radius of the first arc portion may be a distance L+d between the first edge E1S of the source region SR and the first edge E1D of the drain region DR. The second arc portion may be a part of a circumference with respect to the first edge E1D of the drain region DR. The curvature radius of the second arc portion may be a distance 2L+2d between the first edge E1D of the drain region DR and the second edge E2S of the source region SR. The curvature radius of the second arc portion may be 2 times the curvature radius of the first arc portion.

As described above, the channel region CR may be defined as a region between the source region SR and the drain region DR. The channel region CR may also be a line shape having a uniform width. The channel region CR may have the channel length L and the channel width W. As described above, the channel length L may be defined as a distance between the source region SR and the drain region DR, and may be uniform as shown in FIG. 1. The channel width W may be a distance defined according to a direction perpendicular to the channel length L. Since an edge of the channel region CR and the edge region ER is not clear, although the channel width W may not be exactly measured, as shown in FIG. 1, the channel width W may be defined as a distance from the second edge E2S of the source region SR and the second edge E2D of the drain region DR according to a middle points of the source region SR and the drain region DR.

As described above, the source region SR and the drain region DR have spiral shapes, and thus the channel region CR may also have a spiral shape. However, the spiral shapes of the source region SR and the drain region DR are spiral shapes in which two lines having one end disposed in the center and another end disposed outside are spaced apart from each other, whereas the spiral shape of the channel region CR is a spiral shape formed by a single line having all ends disposed outside.

As a result, the channel region CR may include a plurality of first portions C1 having channel lengths in a direction perpendicular to the first direction and a plurality of second portions C2 having channel lengths in a direction perpendicular to the second direction.

When the semiconductor layer 10 elongates and channel lengths of the first portions C1 increase, channels lengths of the second portions C2 decrease. To the contrary, when channel lengths of the second portions C2 increase, channel lengths of the first portions C1 decrease. For example, when the semiconductor layer 10 elongates in the first direction, the semiconductor layer 10 may contract in the second direction. As a result, channels lengths of the second portions C2 increase, whereas channel lengths of the first portions C1 decrease, and thus an overall change in the channel lengths may be compensated. To the contrary, when the semiconductor layer 10 elongates in the second direction, the semiconductor layer 10 may contract in the first direction. As a result, channels lengths of the first portions C1 increase, whereas channel lengths of the second portions C2 decrease, and thus an overall change in the channel lengths may be compensated.

Therefore, although the semiconductor layer 10 elongates in any directions by a tensile force applied from the outside, an average channel length by a shape of the channel region CR according to the present invention may not greatly change. That is, although the semiconductor layer 10 elongates 1%, the average channel length may change at a change rate lower than 1%.

Although the semiconductor layer 10 elongates in any directions, the semiconductor layer 10 contracts in a direction perpendicular to the channel width W, the channel width W hardly changes as a whole. Although the semiconductor layer 10 elongates, since the channel width W and the average channel length hardly change, an aspect ratio slightly changes, and a current characteristic of a TFT including the semiconductor layer 10 hardly changes.

As shown in FIG. 1, the source region SR and the drain region DR may have a 180 degree rotational and symmetrical relationship with respect to the center point C. The channel region CR may also be 180 degree rotational and symmetrical with respect to the center point C.

As described above, impurity ions are doped with the source region SR and the drain region DR so that the source region SR and the drain region DR may have a conductivity higher than the channel region CR. To this end, an ion implanting process for doping impurity ions may be performed only on the source region SR and the drain region DR. In this case, a source electrode (not shown) may be electrically connected to a part of the source region SR. A drain electrode (not shown) may be electrically connected to a part of the drain region DR. The source electrode and the drain electrode may be connected to the source region SR and the drain region DR, respectively, by using contact plugs.

The source region SR and the drain region DR may be limited by the source electrode (not shown) and the drain electrode (not shown). That is, the source region SR is a region where the semiconductor layer 10 contacts the source electrode, and the drain region DR is a region where the semiconductor layer 10 contacts the drain electrode. In this regard, the source electrode and the drain electrode may be formed of a conductive material such as a silver nano wire, a carbon nano tube, graphene, and ITO. The source electrode and the drain electrode may be elongatable transparent conductors. Another material layer for another purpose, for example, to reduce a contact resistance, may be disposed between the semiconductor layer 10 and the source electrode and between the semiconductor layer 10 and the drain electrode.

For better understanding of the present invention, various embodiments including a source electrode and a drain electrode disposed on the semiconductor layer 10 instead of the source region SR and the drain region DR that are included in the semiconductor layer 10 are described below. The source electrode and the drain electrode may respectively present a source region and a drain region. When the source electrode and the drain electrode are connected to the source region and the drain region by using contact plugs, the source electrode and the drain electrode present the source region and the drain region having conductivity in the semiconductor layer 10.

Line V-V of FIG. 1 will be described later with respect to FIGS. 5A through 5G.

Figure 2A:
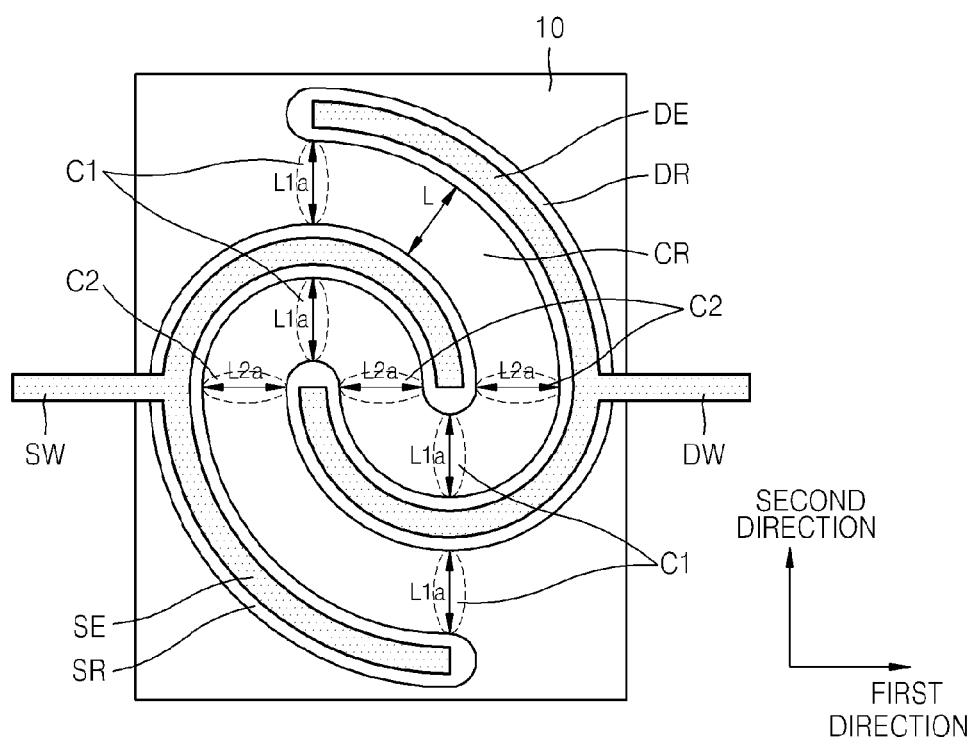
FIGS. 2A through 2C are schematic top plan views illustrating a source electrode and a drain electrode that are disposed on the semiconductor layer of FIG. 1.
Figure 2B:
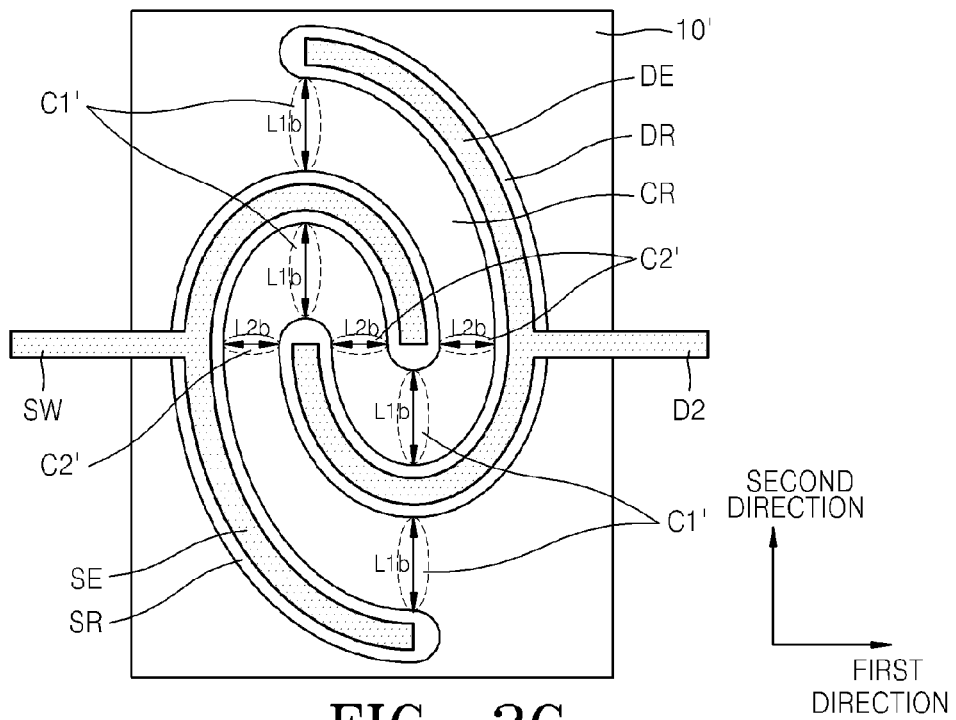
Figure 2C:
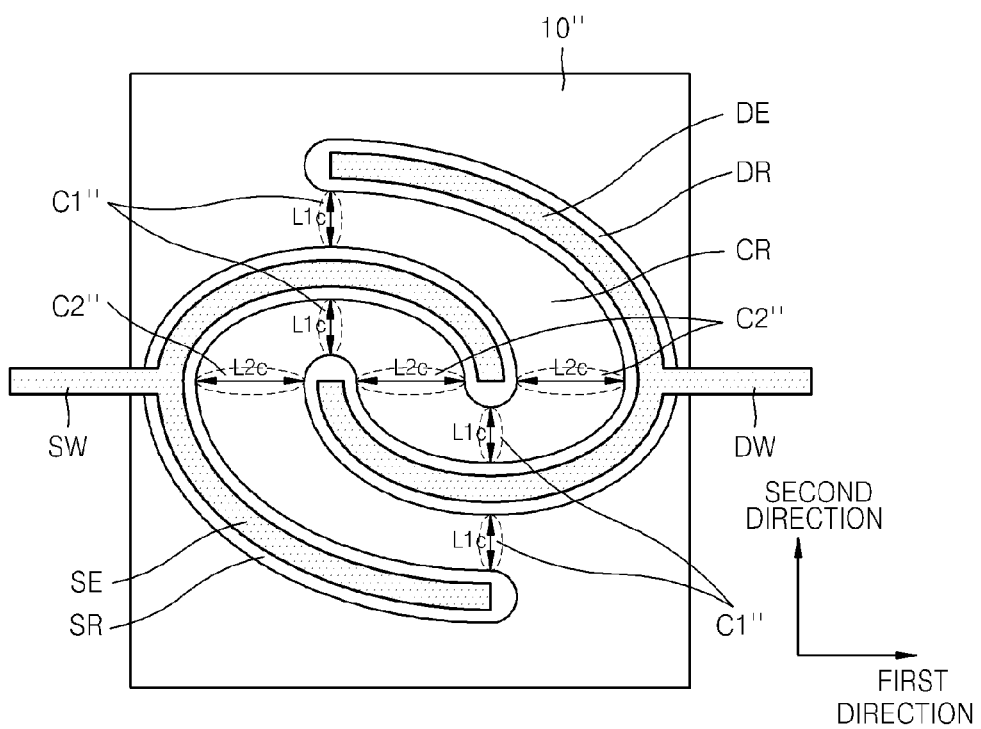

FIGS. 2A through 2C are schematic top plan views illustrating a source electrode and a drain electrode that are disposed on the semiconductor layer 10 of FIG. 1. FIG. 2A shows the semiconductor layer 10 that has not been elongated in any direction. FIG. 2B shows a semiconductor layer 10' that is elongated in a second direction. FIG. 2C shows a semiconductor layer 10" that is elongated in a first direction.

Referring to FIG. 2A, the semiconductor layer 10 includes the source region SR, the channel region CR, and the drain region DR. A source electrode SE is disposed on the source region SR and connected to a source wire SW. A drain electrode DE is disposed on the drain region DR and connected to a drain wire DW. The present invention is not limited to a point at which the source wire SW and the drain wire DW are connected to the source electrode SE and the drain electrode DE. The semiconductor layer 10 has not been elongated in any direction.

Although not shown in FIG. 2A, the semiconductor layer 10 may be disposed on a substrate (not shown) and include a bottom surface facing the substrate and a top surface opposite to the bottom surface. As shown, the source electrode SE and the drain electrode DE may be disposed on the semiconductor layer 10. More specifically, the source electrode SE and the drain electrode DE may be disposed on the bottom surface of the semiconductor layer 10 or the top surface thereof.

As described with reference to FIG. 1, the channel region CR may be defined as a region between the source region SR and the drain region DR and have the uniform channel length L. The channel region CR may include the plurality of first portions C1 having channel lengths in a direction perpendicular to a first direction and the plurality of second portions C2 having channel lengths in a direction perpendicular to a second direction.

Channel lengths of the first portions C1 may be denoted as L1a. Channel lengths of the second portions C2 may be denoted as L2a. However, all channel lengths of the first portions C1 and the second portions C2 may be uniform as L. Thus, an average channel length may be L.

Referring to FIG. 2B, a semiconductor layer 10' is elongated in the second direction. If a material elongates, since the material contracts in a direction perpendicular to an elongated direction, the material contracts in the first direction. As a result, the first portions C1' of the channel region CR elongate in the second direction, and the second portions C2' contract in the first direction. Thus, channel lengths of the first portions C1' increase to L1b, and channel lengths of the second portions C2' decrease to L2b. As the semiconductor layer 10' elongates, channel lengths of the first portions C1' increase, whereas channel lengths of the second portions C2' decrease, and thus an average channel length hardly changes from L. An area occupied by the first portions C1' and an area occupied by the second portions C2' may be adjusted such that the average channel length becomes L.

Referring to FIG. 2C, the semiconductor layer 10'' elongates in the first direction. If a material elongates, since the material contracts in a direction perpendicular to an elongated direction, the material contracts in the second direction. As a result, the second portions C2'' of the channel region CR elongate in the first direction, and the first portions C1'' contract in the second direction. Thus, channel lengths of the second portions C2'' increase to L2c, and channel lengths of the first portions C1'' decrease to L1c. As the semiconductor layer 10'' elongates, channel lengths of the second portions C2'' increase, whereas channel lengths of the first portions C1'' decrease, and thus an average channel length hardly changes from L. An area occupied by the first portions C1'' and an area occupied by the second portions C2'' may be adjusted such that the average channel length becomes L.

FIGS. 3A through 3D are schematic top plan views illustrating various modifications of the source electrode and the drain electrode of FIG. 2A. Elements of the modifications of FIGS. 3A through 3D are substantially similar to those of FIG. 2A, and thus differences therebetween will now be described.

Figure 3A:
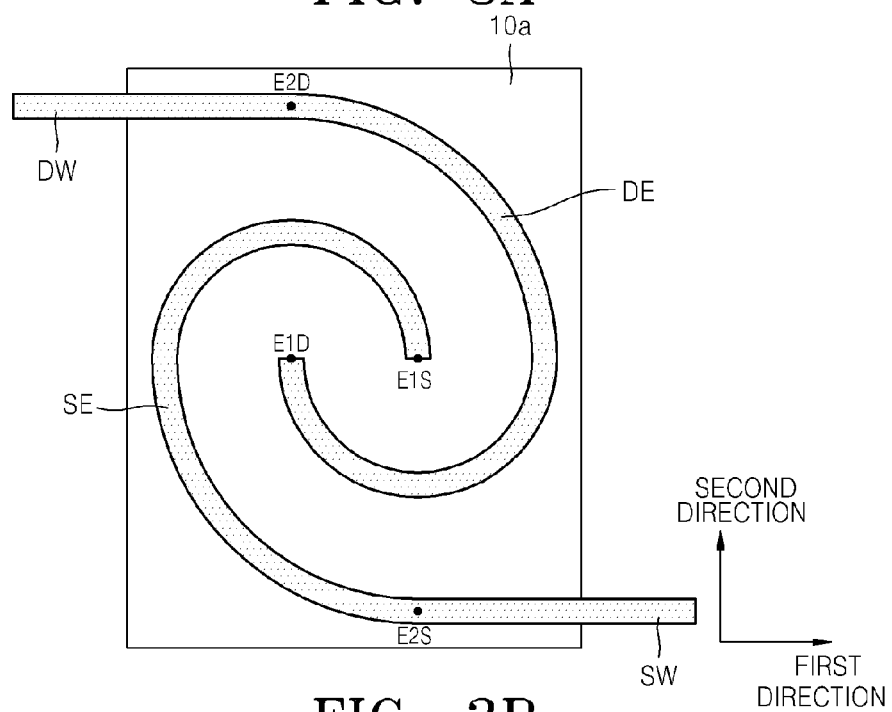
FIGS. 3A through 3D are schematic top plan views illustrating various modifications of the source electrode and the drain electrode of FIG. 2A.

Referring to FIG. 3A, the source electrode SE and the drain electrode DE are disposed on a semiconductor layer 10a. For better understanding of the present invention, the source region SR and the drain region DR are not shown. However, details of the source region SR and the drain region DR such as locations or sizes will be understood by one of ordinary skill in the art with reference to FIGS. 1 and 2A.

The source wire SW and the drain wire DW of FIG. 2A are connected in the middle of the source electrode SE and the drain electrode DE, whereas in FIG. 3A, the source wire SW is directly connected to the source electrode SE in the second edge E2S and the drain wire DW is directly connected to the drain electrode DE in the second edge E2D. The source wire SW and the drain wire DW may be modified in various ways and may be connected at locations other than the second edges E2S and E2D in other directions. The source wire SW and the drain wire DW may be connected to the source electrode SE and the drain electrode DE through contact plugs (not shown).

Figure 3B:
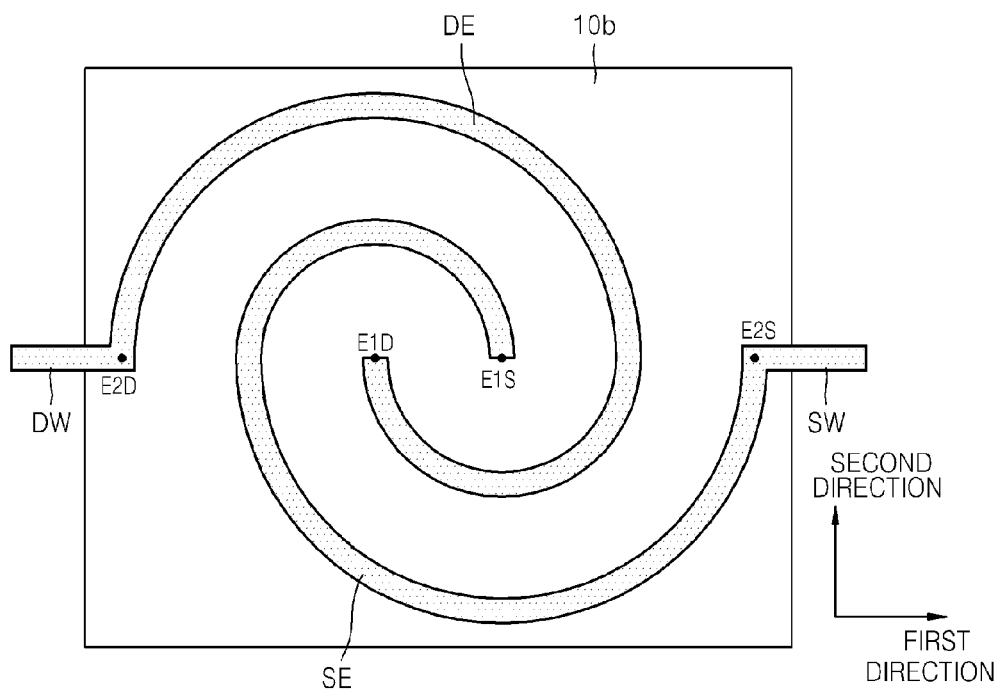

Referring to FIG. 3B, the source electrode SE and the drain electrode DE are disposed on the semiconductor layer 10b. The source electrode SE of FIG. 3B is longer than the source electrode of FIG. 2A, and a greater part thereof surrounds the drain electrode DE than that of the source electrode SE of FIG. 2A. In terms of a numerical value, if the source electrode SE of FIG. 2A surrounds the drain electrode DE at approximately 270 degrees, whereas the source electrode SE of FIG. 3A surrounds the drain electrode DE at approximately 360 degrees.

The drain electrode DE of FIG. 3B is longer than the drain electrode DE of FIG. 2A, and a greater part thereof surrounds the source electrode SE than that of the drain electrode DE of FIG. 2A. The drain electrode DE of FIG. 3A surrounds the source electrode SE at approximately 360 degrees.

The present invention is not limited to the shape of FIG. 3B. The source electrode SE and the drain electrode DE may surround a center point at a greater number of frequencies. That is, the source electrode SE and the drain electrode DE may surround the center point at angles of such as 540 degrees and 720 degrees.

Figure 3C:
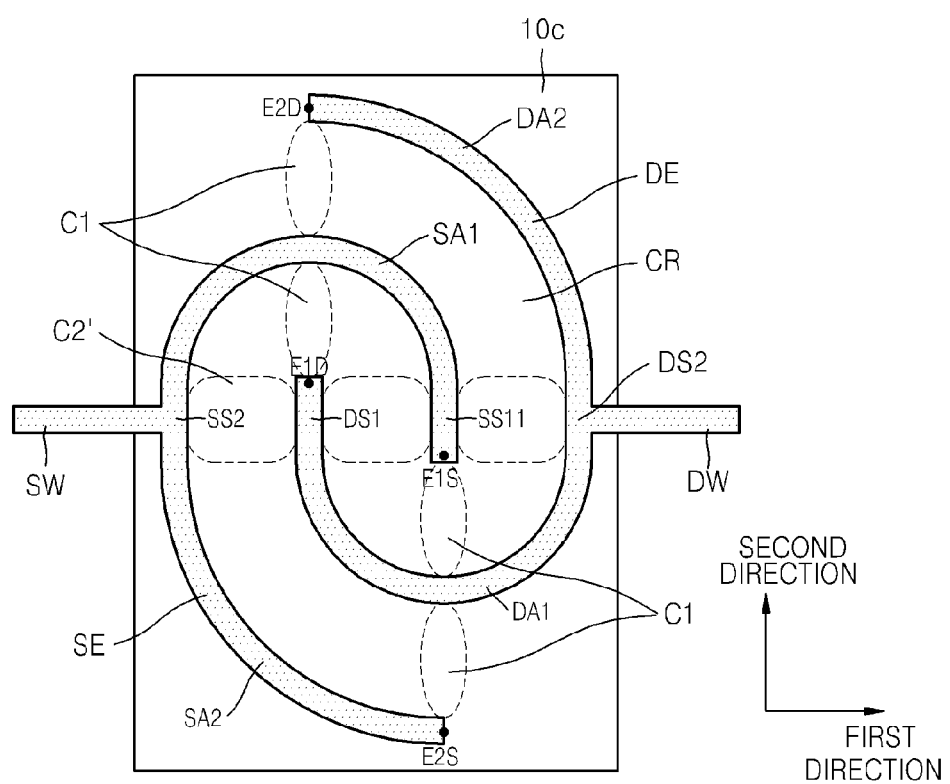

Referring to FIG. 3C, the source electrode SE and the drain electrode DE are disposed on a semiconductor layer 10c. When the source electrode SE and the drain electrode DE of FIG. 3C are compared to the source electrode SE and the drain electrode DE of FIG. 3A, the source electrode SE and the drain electrode DE of FIG. 3C further include first and second rectilinear portions SS1, SS2 of the source electrode SE and first and second rectilinear portions D1, DS2 of the drain electrode DE. That is, the source electrode SE disposed on the semiconductor layer 10c may include the first rectilinear portion SS1, a first arc portion SA1, the second rectilinear portion SS2, and a second arc portion SA2 that are sequentially connected between the first edge E1S and the second edge E2S. The drain electrode DE may include the first rectilinear portion DS1, a first arc portion DA1, the second rectilinear portion DS2, and a second arc portion DA2 that are sequentially connected between the first edge E1D and the second edge E2D.

As described with reference to FIG. 1 above, the first arc portion SA1 of the source electrode SE may be a part of a circumference with respect to the first edge E1D of the drain electrode DE, and the first arc portion DA1 of the drain electrode DE may be a part of a circumference with respect to the first edge E1S of the source electrode SE. The second arc portion SA2 of the source electrode SE may be a part of a circumference with respect to the first edge E1S of the source electrode SE like the first arc portion DA1 of the drain electrode DE, and the second arc portion DA2 of the drain electrode DE may be a part of a circumference with respect to the first edge E1D of the drain electrode DE like the first arc portion SA1 of the source electrode SE.

The first rectilinear portion SS1 of the source electrode SE may connect the first edge E1S and one end of the first arc portion SA1. The second rectilinear portion SS2 of the source electrode SE may connect another end of the first arc portion SA1 and one end of the second edge E2S. The first rectilinear portion DS1 of the drain electrode DE may connect the first edge E1D and one end of the first arc portion DA1. The second rectilinear portion DS2 of the drain electrode DE may connect another end of the first arc portion DA1 and one end of the second arc portion DA2.

The first rectilinear portion SS1 and the second rectilinear portion SS2 of the source electrode SE and the first rectilinear portion DS1 and the second rectilinear portion DS2 of the drain electrode DE may have the same lengths and extend in the same direction. The second rectilinear portion SS2 of the source electrode SE, the first rectilinear portion DS1 of the drain electrode DE, the first rectilinear portion SS1 of the source electrode SE, and the second rectilinear portion DS2 of the drain electrode DE may be spaced apart from each other by a uniform gap.

Since the source electrode SE and the drain electrode DE further include the first and second rectilinear portions SS1, SS2 and DS1, DS2, areas of second portions C2' of the channel region CR having channel lengths in a direction perpendicular to a second direction may increase. Accordingly, change levels of channel lengths of the first portions C1 and opposite change levels of channel lengths of the second portions C2' may be exactly consistent with each other. Although the first and second rectilinear portions SS1, SS2 and DS1, DS2 elongate in any directions, lengths thereof may be selected such that an average channel length may be uniform to L.

Figure 3D:
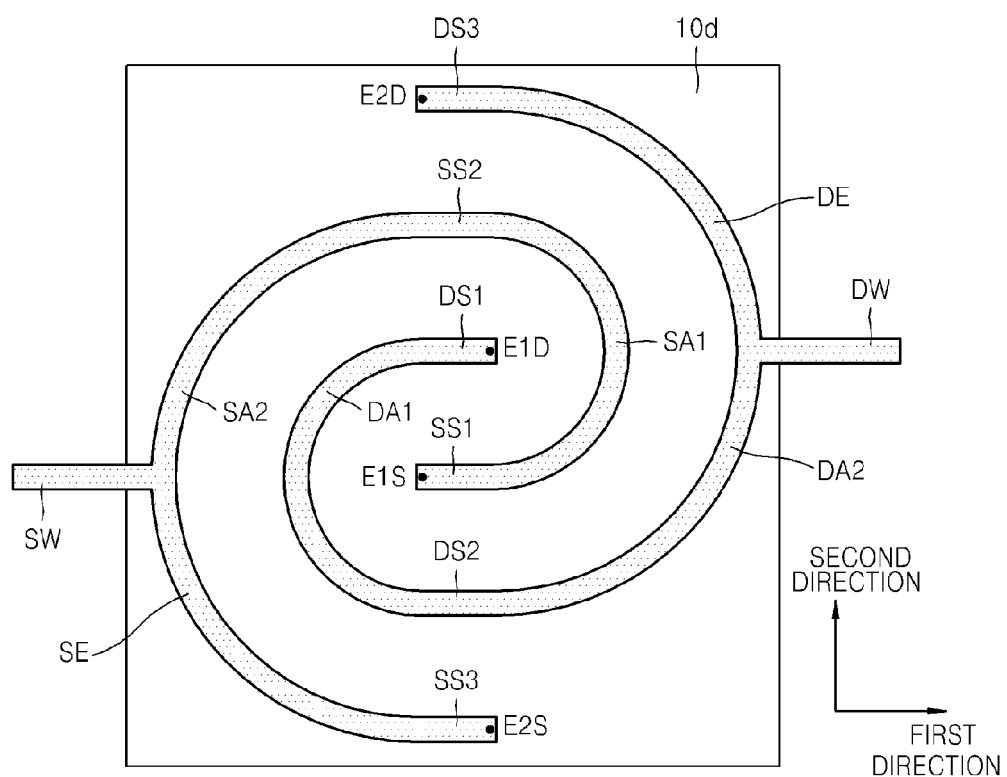

Referring to FIG. 3D, the source electrode SE and the drain electrode DE are disposed on a semiconductor layer 10d. When the source electrode SE and the drain electrode DE disposed on the semiconductor layer 10d are compared to the source electrode SE and the drain electrode DE of FIG. 3B, the source electrode SE and the drain electrode DE of FIG. 3D rotate by 90 degrees counterclockwise and further include first through third rectilinear portions SS1-SS3 and DS1-DS3.

That is, the source electrode SE disposed on the semiconductor layer 10d may include the first rectilinear portion SS1, the first arc portion SA1, the second rectilinear portion SS2, the second arc portion SA2, and the third rectilinear portion SS3 that are sequentially connected between the first edge E1S and the second edge E2S. Also, the drain electrode DE may include the first rectilinear portion DS1, the first arc portion DA1, the second rectilinear portion DS2, the second arc portion DA2, and the third rectilinear portion DS3 that are sequentially connected between the first edge E1D and the second edge E2D.

As shown in FIG. 3D, the source electrode SE and the drain electrode DE may be modified in various ways.

Figure 4A:
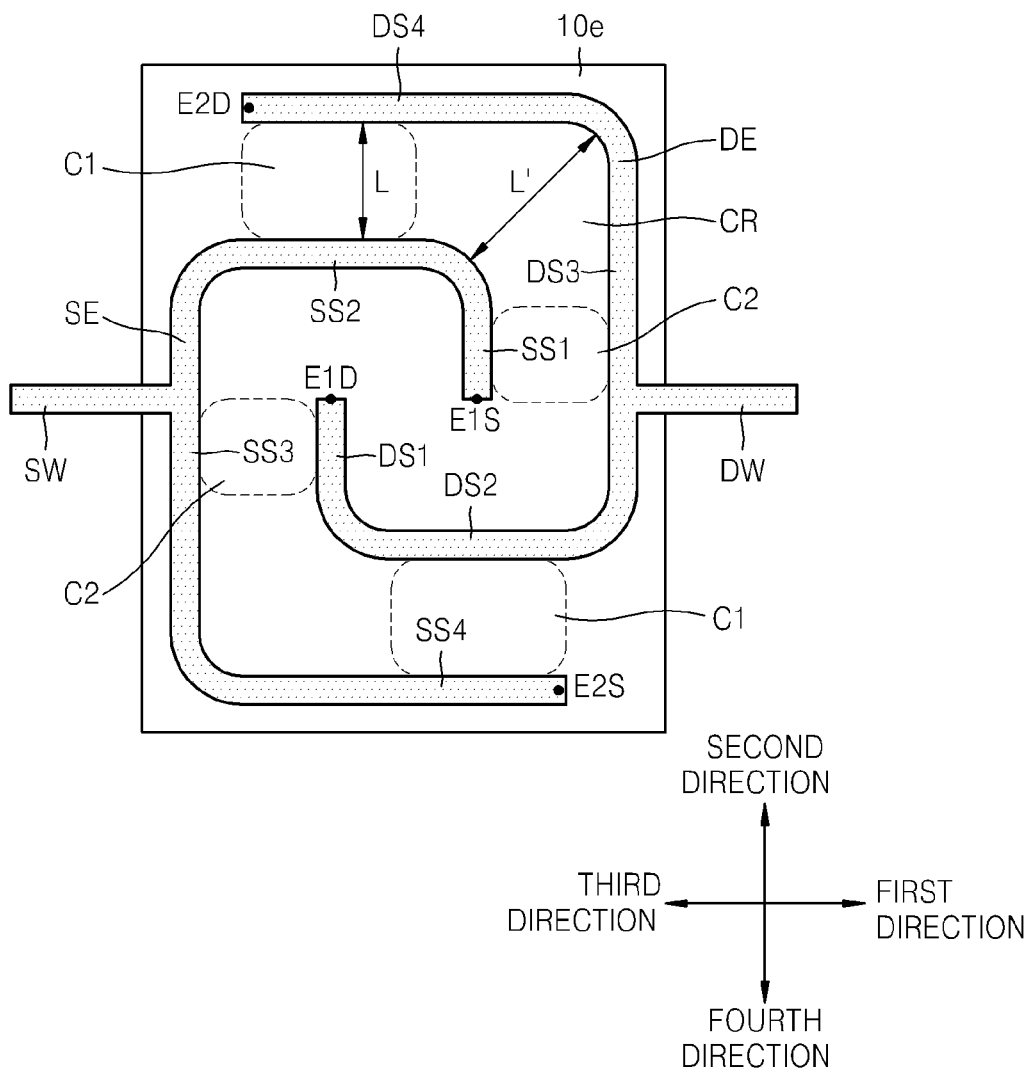
FIGS. 4A through 4C are schematic top plan views illustrating various modifications of the source electrode and the drain electrode of FIG. 2A.
Figure 4B:
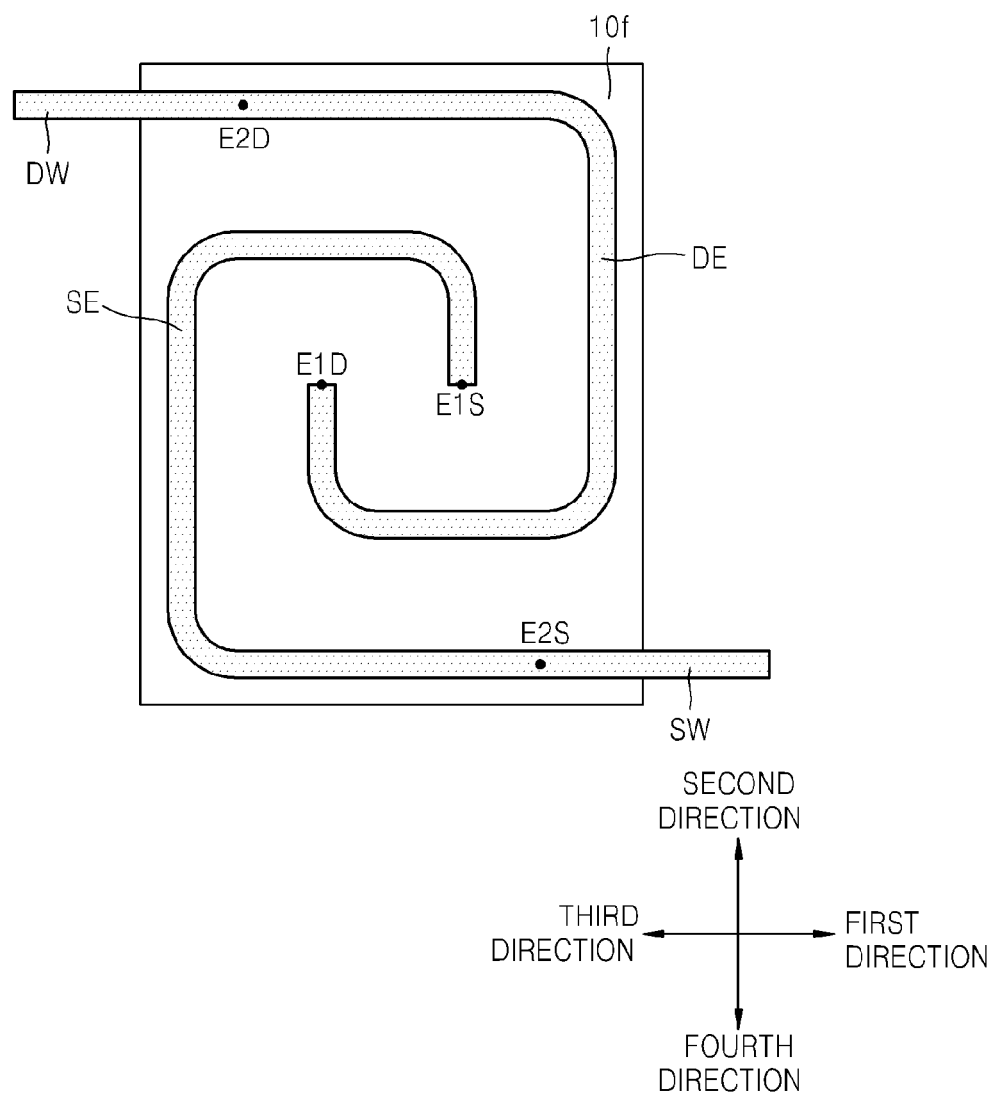
Figure 4C:
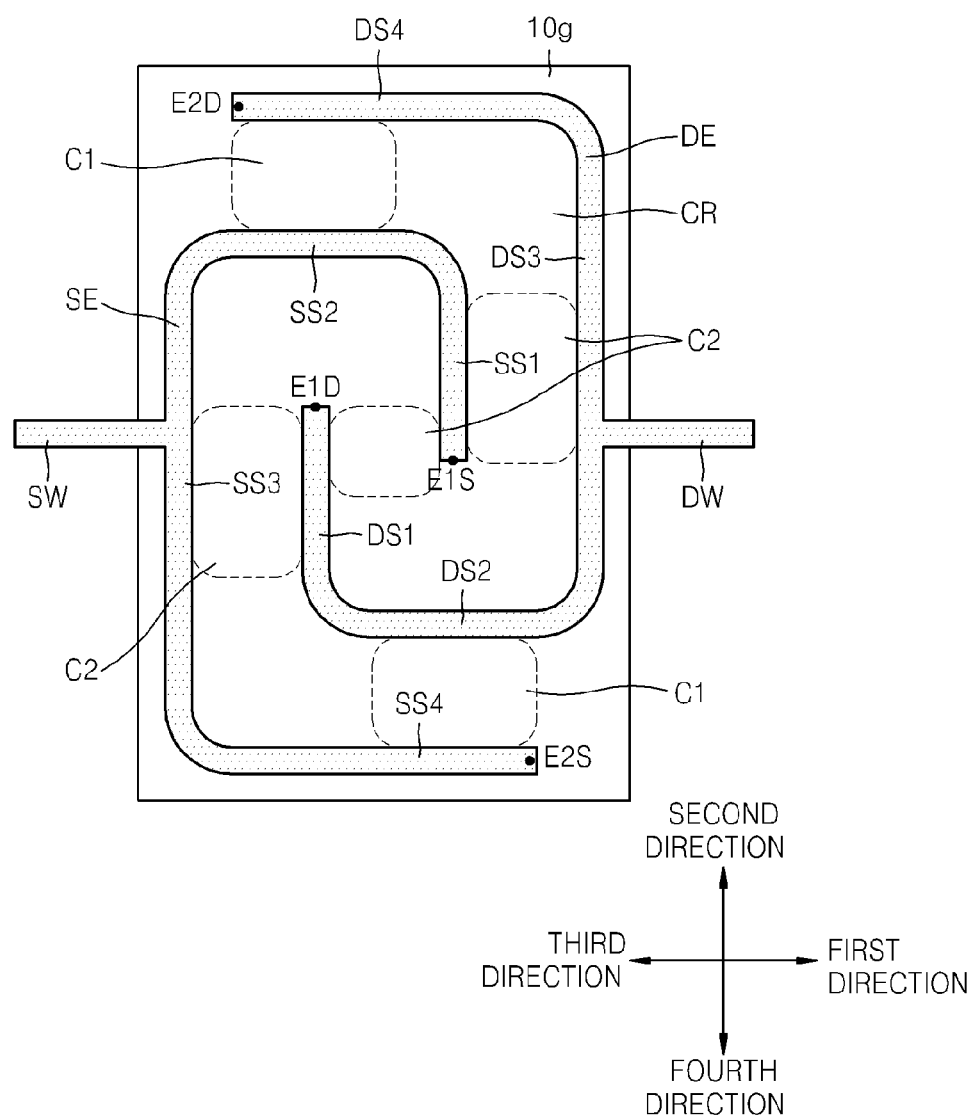

FIGS. 4A through 4C are schematic top plan views illustrating various modifications of the source electrode and the drain electrode of FIG. 2A. Elements of the modifications of FIGS. 4A through 4C are substantially similar to those of FIG. 2A, and thus differences therebetween will now be described.

Referring to FIG. 4A, the source electrode SE and the drain electrode DE are disposed on a semiconductor layer 10e. The source electrode SE and the drain electrode DE may have rectangular spiral shapes as shown in FIG. 4A. The semiconductor layer 10e may extend in a first direction and a second direction perpendicular to the first direction. An opposite direction to the first direction may be referred to as a third direction. An opposite direction to the second direction may be referred to as a fourth direction. The source wire SW is connected to the source electrode SE. The drain wire DW is connected to the drain electrode DE.

More specifically, the source electrode SE may have a line shape having the first edge E1S and the second edge E2S, and the drain electrode DE may have a line shape having the first edge E1D and the second edge E2D.

The source electrode SE may include the first portion SS1 extending from the first edge E1S to the second direction, the second portion SS2 connected to the first portion SS1 and extending in the third direction, a third portion SS3 connected to the second portion SS2 and extending in the fourth direction, and a fourth portion SS4 connected to the third portion SS3, extending in the first direction, and ending in the second edge E2S. Although the first through fourth portions SS1~SS4 may be connected to each other via curved portions as shown, this is exemplary and may be connected to each other at right angles. All the first through fourth portions SS1~SS4 have rectangular spiral shapes, and thus the third portion SS3 is disposed outside compared to the first portion SS1, and the fourth portion SS4 is disposed outside compared to the second portion SS2. Therefore, the third portion SS3 and the fourth portion SS4 have lengths longer than the first portion SS1 and the second portion SS2.

The drain electrode DE may also include the first portion DS1 extending from the first edge E1D to the fourth direction, the second portion DS2 connected to the first portion DS1 and extending in the first direction, a third portion DS3 connected to the second portion DS2 and extending in the second direction, and a fourth portion DS4 connected to the third portion DS3, extending in the third direction, and ending in the second edge E2D.

The semiconductor layer 10e may include the channel region CR between the source electrode SE and the drain electrode DE. The channel region CR may have a channel length that varies from L to L' according to its location.

The channel region CR may include the first portions C1 having channel lengths in the direction perpendicular to the first direction and the second portions C2 having channel lengths in the direction perpendicular to the second direction. Parts of the first portions C1 and second portions C2 are exemplary shown in FIG. 4A.

As described above, since the semiconductor layer 10e extends, channel lengths of the first portions C1 and channel lengths of the second portions C2 change the other way around, and thus an average channel length does not greatly change as a whole.

Referring to FIG. 4B, the source electrode SE and the drain electrode DE are disposed on a semiconductor layer 10f. The source wire SW is connected to the second edge E2S of the source electrode SE. The drain wire DW is connected to the second edge E2D of the drain electrode DE. In this case, the source wire SW and the source electrode SE and the drain wire DW and the drain electrode DE may be concurrently formed during the same process.

As described with reference to FIG. 4B above, the source wire SW and the drain wire DW may be connected to any portions of the source electrode SE and the drain electrode DE. Although not shown, the source electrode SE and the drain electrode DE may further include pads for connecting the source electrode SE and the drain electrode DE to the source wire SW and the drain wire DW.

Referring to FIG. 4C, the source electrode SE and the drain electrode DE are disposed on the semiconductor layer 10g. When the source electrode SE and the drain electrode DE that are disposed on the semiconductor layer 10g are compared to the source electrode SE and the drain electrode DE of FIG. 4A, lengths of the first and third portions SS1 and SS3 and the source electrode SE are increased, and accordingly, lengths of the drain electrode DE and the first and third portions DS1 and the DS3 are increased.

As described with reference to FIG. 4C above, areas of the second portions C2 of the channel region CR may change by changing lengths of the first and third portions SS1, SS3 and DS1, DS3. As a result, channel lengths of the second portions C2 may reversely change in accordance with changes in channel lengths of the first portions C1 of the channel region CR. Thus, lengths of the first and third portions SS1, SS3 and DS1, DS3 may be adjusted such that the average channel length does not change.

FIGS. 5A through 5G are cross-sectional views of thin film semiconductor devices 100a through 100g according to embodiments of the present invention.

Figure 5A:
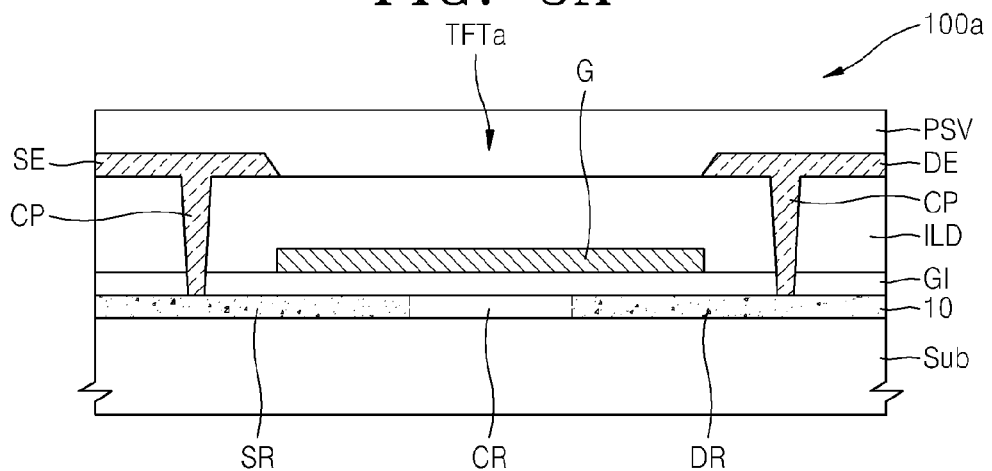
FIGS. 5A through 5G are cross-sectional views of a thin film semiconductor device according to an embodiment of the present invention.

Referring to FIG. 5A, the thin film semiconductor device 100a includes a substrate Sub and a thin film transistor TFTa disposed on the substrate Sub. The thin film transistor TFTa may include the semiconductor layer 10, the gate electrode G, the source electrode SE, and the drain electrode DE. FIG. 5A is a cross-sectional view illustrating the thin film semiconductor device 100a, taken along line V-V of FIG. 1.

The substrate Sub may be a flexible substrate. For example, the substrate Sub may be formed of a plastic material having excellent heat resistance and durability such as polyimide (PI), polyethylene terephthalate (PET), polyethylene naphtalate (PEN), polycarbonate (PC), polyarylate (PAR), polyetherimide (PEI), and polyethersulphone (PES). However, the present invention is not limited thereto, and the substrate Sub may use various flexible materials such as a metal foil or thin film glass. The substrate Sub may elongate in any direction according to an external tensile force.

Meanwhile, the substrate Sub may be a rigid substrate and may be formed of a transparent glass material having silicon oxide ($SiO_2$) as a main component.

The semiconductor layer 10 may be disposed on the substrate Sub. As described with reference to FIG. 1 above, the semiconductor layer 10 may be an element semiconductor layer including a 4-group element such as silicon and germanium. In this case, the source region SR and the drain region DR may be doped with impurity ions and have conductivity. The channel region CR may be lightly doped with impurity ions. In this case, conductivity of impurity ions doped on the channel region CR may be opposite to that of impurity ions doped on the source region SR and the drain region DR.

The semiconductor layer 10 may be a compound semiconductor layer formed of a compound semiconductor such as an oxide semiconductor or an organic semiconductor layer formed of an organic semiconductor.

Although not shown, a buffer layer (not shown) may be disposed between the semiconductor layer 10 and the substrate Sub to prevent impurities from introducing from the substrate Sub.

A gate insulation layer G1 including an insulation material such as, silicon oxide, silicon nitride, and/or silicon oxynitride, is formed on the semiconductor layer 10. The gate electrode G may be disposed on a predetermined region of the gate insulation layer G1. The gate electrode G may be connected to a gate line (not shown) to which a control signal for controlling the thin film transistor TFTa is applied.

An interlayer insulation layer ILD may be disposed on the gate electrode G. The interlayer insulation layer ILD may include a contact hole for exposing the source region SR and the drain region DR of the semiconductor layer 10. The source electrode SE and the drain electrode DE may be electrically connected to the source region SR and the drain region DR, respectively, through contact plugs CP buried in the contact hole of the interlayer insulation layer ILD. The above-formed thin film transistor TFTa may be protected by being covered by a passivation layer PSV.

Figure 5B:
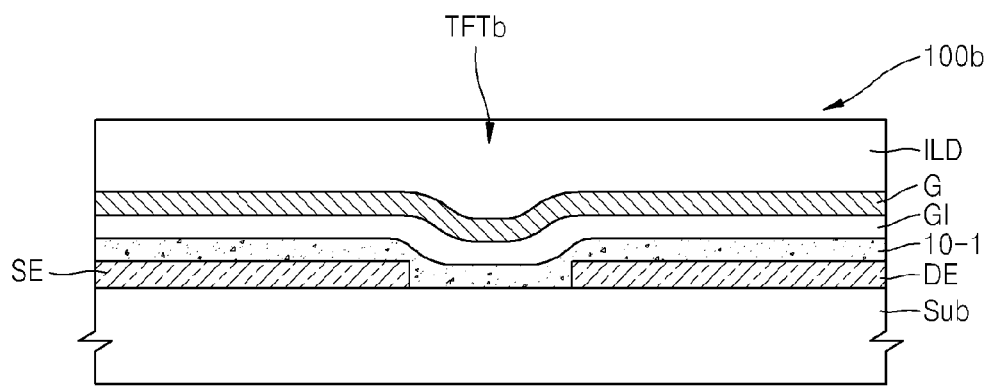

Referring to FIG. 5B, the thin film semiconductor device 100b, taken along the line V-V of FIG. 1, includes the substrate Sub and a thin film transistor TFTb disposed on the substrate Sub. The thin film transistor TFTb may include a semiconductor layer 10-1, the gate electrode G, the source electrode SE, and the drain electrode DE.

The semiconductor layer 10-1 and the gate electrode G may be sequentially stacked on the substrate Sub. The substrate Sub may be an elongatable plastic substrate. The semiconductor layer 10-1 may be an elongatable oxide semiconductor layer or organic semiconductor layer.

The source electrode SE and the drain electrode DE may be disposed between the substrate Sub and the semiconductor layer 10-1. Other material layers having conductivity may be disposed between the source electrode SE, the drain electrode DE, and the semiconductor layer 10-1.

The gate insulation layer GI may be disposed between the semiconductor layer 10-1 and the gate electrode G. Although the gate insulation layer GI may be shown as a single layer, the gate insulation layer GI may have a stack structure of a plurality of insulation materials.

The above-formed thin film transistor TFTb may be covered by the interlayer insulation layer ILD.

Figure 5C:
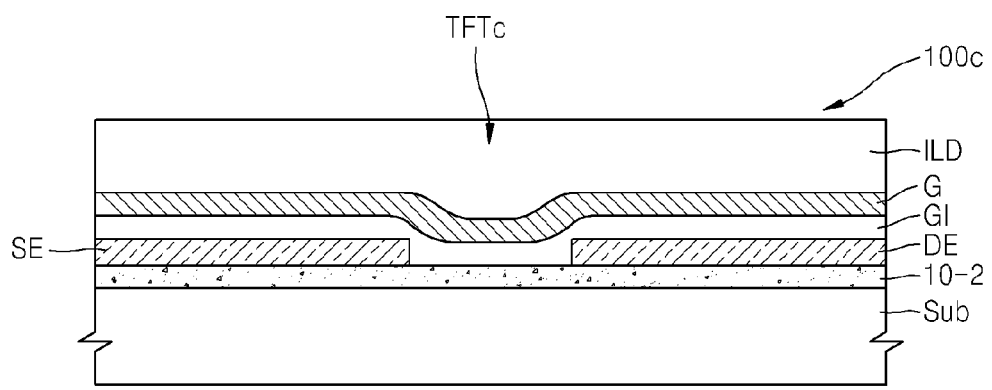

Referring to FIG. 5C, the thin film semiconductor device 100c, taken along the line V-V of FIG. 1, includes the substrate Sub and a thin film transistor TFTc disposed on the substrate Sub. The thin film transistor TFTc may include a semiconductor layer 10-2, the gate electrode G, the source electrode SE, and the drain electrode DE.

The semiconductor layer 10-2 and the gate electrode G may be sequentially stacked on the substrate Sub. A buffer layer (not shown) may be disposed between the substrate Sub and the semiconductor layer 10-2. The source electrode SE and the drain electrode DE and the gate insulation layer GI that covers the source electrode SE and the drain electrode DE may be disposed between the semiconductor layer 10-2 and the gate electrode G. The above-formed thin film transistor TFTc may be covered by the interlayer insulation layer ILD.

Figure 5D:
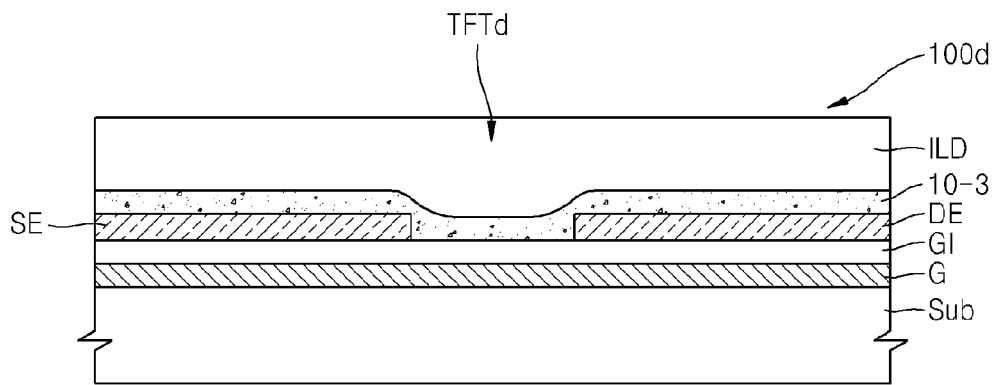

Referring to FIG. 5D, the thin film semiconductor device 100d, taken along the line V-V of FIG. 1, includes the substrate Sub and a thin film transistor TFTd disposed on the substrate Sub. The thin film transistor TFTd may include a semiconductor layer 10-3, the gate electrode G, the source electrode SE, and the drain electrode DE.

The gate electrode G and the semiconductor layer 10-3 may be sequentially stacked on the substrate Sub. A buffer layer (not shown) may be disposed between the substrate Sub and the gate electrode G. The gate insulation layer GI may be disposed to cover the gate electrode G. The source electrode SE and the drain electrode DE may be disposed between the gate insulation layer GI and the semiconductor layer 10-3. The above-formed thin film transistor TFTd may be covered by the interlayer insulation layer ILD.

Figure 5E:
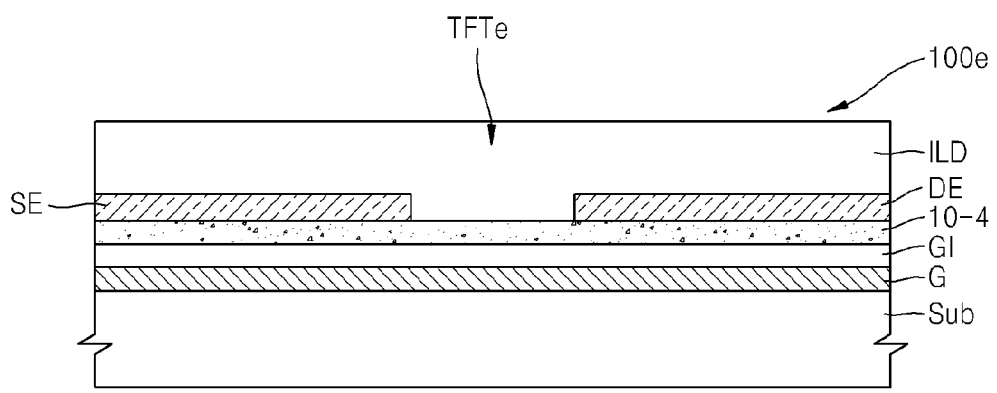

Referring to FIG. 5E, the thin film semiconductor device 100e, taken along the line V-V of FIG. 1, includes the substrate Sub and a thin film transistor TFTe disposed on the substrate Sub. The thin film transistor TFTe may include a semiconductor layer 10-4, the gate electrode G, the source electrode SE, and the drain electrode DE.

The gate electrode G and the semiconductor layer 10-4 may be sequentially stacked on the substrate Sub. A buffer layer (not shown) may be disposed between the substrate Sub and the gate electrode G. The gate insulation layer GI may be disposed between the gate electrode G and the semiconductor layer 10-4. The source electrode SE and the drain electrode DE may be disposed on the semiconductor layer 10-4. The source electrode SE and the drain electrode DE may be covered by the interlayer insulation layer ILD.

Figure 5F:
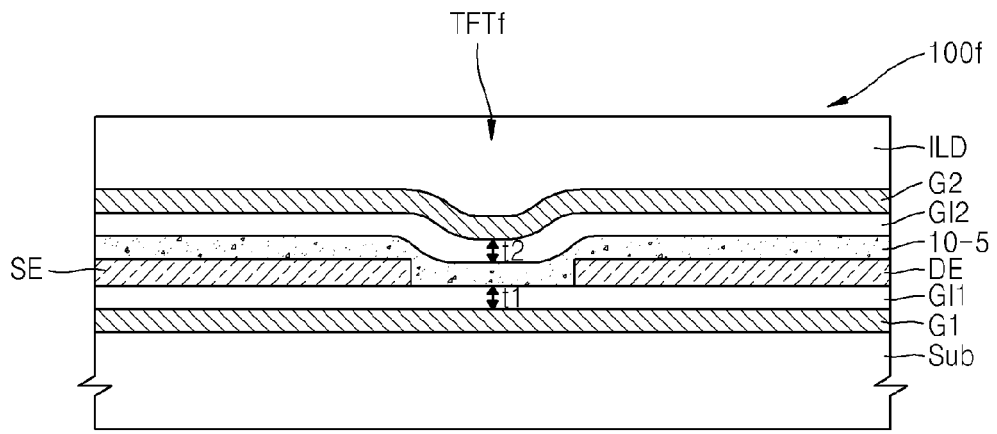

Referring to FIG. 5F, the thin film semiconductor device 100f, taken along the line V-V of FIG. 1, includes the substrate Sub and a thin film transistor TFTf disposed on the substrate Sub. The thin film transistor TFTf may include a semiconductor layer 10-5, a bottom gate electrode G1, a top gate electrode G2, the source electrode SE, and the drain electrode DE.

The bottom gate electrode G1, the semiconductor layer 10-5, and the top gate electrode G2 may be sequentially stacked on the substrate Sub. A buffer layer (not shown) may be disposed between the substrate Sub and the bottom gate electrode G1.

A bottom gate insulation layer GI1 may be disposed between the bottom gate electrode G1 and the semiconductor layer 10-5. A top gate insulation layer GI2 may be disposed between the top gate electrode G2 and the semiconductor layer 10-5. A thickness of the bottom gate insulation layer GI1 disposed below a channel region of the semiconductor layer 10-5 may be t1. A thickness of the top gate insulation layer GI2 disposed above the channel region of the semiconductor layer 10-5 may be t2.

The source electrode SE and the drain electrode DE may be disposed between the bottom gate insulation layer GI1 and the semiconductor layer 10-5. The top gate electrode G2 may be covered by the interlayer insulation layer ILD.

The bottom gate electrode G1 and the top gate electrode G2 may be electrically connected to each other and have a common electric potential. That is, the thin film semiconductor device 100f may be controlled by a voltage commonly applied to the bottom gate electrode G1 and the top gate electrode G2. The thin film semiconductor device 100f may be flexible. When the thin film semiconductor device 100f bends at the channel region, a distance t1 from the semiconductor layer 10-5 to the bottom gate electrode G1 and a distance t2 from the semiconductor layer 10-5 to the top gate electrode G2 may vary. As a result, an intensity of an electric field applied to the channel region of the thin film semiconductor device 100f from the bottom gate electrode G1 and the top gate electrode G2 may vary.

However, in the thin film semiconductor device 100f of the present invention, since the bottom gate electrode G1 and the top gate electrode G2 are disposed on a bottom portion and a top portion of the semiconductor layer 10-5, respectively, when the distance t1 from the semiconductor layer 10-5 to the bottom gate electrode G1 decreases, the distance t2 from the semiconductor layer 10-5 to the top gate electrode G2 increases, and thus the intensity of the electric field applied to the channel region of the thin film semiconductor device 100f from the bottom gate electrode G1 and the top gate electrode G2 may be uniform, and an electrical characteristic of the thin film semiconductor device 100f may not greatly change. The distance t1 from the semiconductor layer 10-5 to the bottom gate electrode G1 and the distance t2 from the semiconductor layer 10-5 to the top gate electrode G2 may be the same.

Figure 5G:
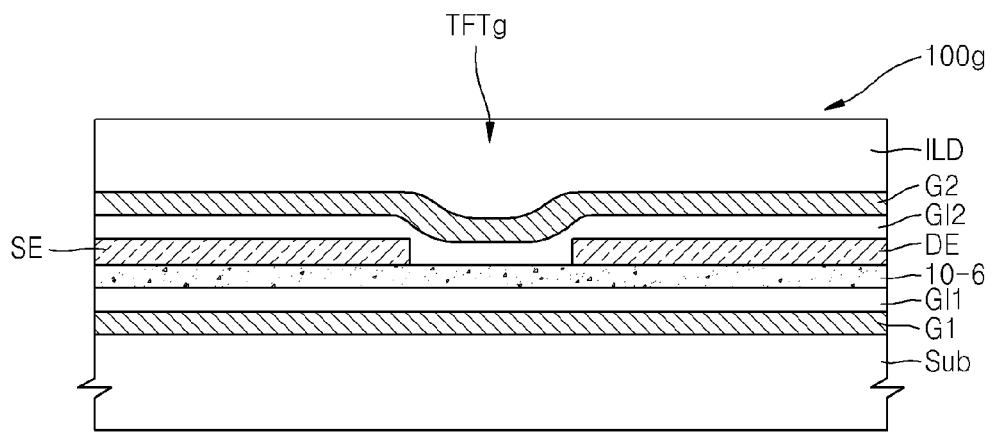

Referring to FIG. 5G, the thin film semiconductor device 100g, taken along the line V-V of FIG. 1, includes the substrate Sub and a thin film transistor TFTg disposed on the substrate Sub. The thin film transistor TFTg may include a semiconductor layer 10-6, a bottom gate electrode G1, a top gate electrode G2, the source electrode SE, and the drain electrode DE.

The bottom gate electrode G1, the semiconductor layer 10-6, and the top gate electrode G2 may be sequentially stacked on the substrate Sub. A buffer layer (not shown) may be disposed between the substrate Sub and the bottom gate electrode G1.

The bottom gate insulation layer GI1 may be disposed between the bottom gate electrode G1 and the semiconductor layer 10-6. The top gate insulation layer GI2 may be disposed between the top gate electrode G2 and the semiconductor layer 10-6. The source electrode SE, and the drain electrode DE may be disposed between the top gate insulation layer GI2 and the semiconductor layer 10-6. The top gate insulation layer GI2 may be covered by interlayer insulation layer ILD.

The bottom gate electrode G1 and the top gate electrode G2 may be electrically connected to each other and have a common electric potential.

At least a part of the gate electrodes G, G1, and G2 of FIGS. 5A through 5G may overlap with channel regions of the semiconductor layers 10 and 10-1 through 10-6. A part of the gate electrodes G, G1, and G2 may overlap with the semiconductor layers 10 and 10-1 through 10-6 or the gate electrodes G, G1, and G2 may overlap with a part of the semiconductor layers 10 and 10-1 through 10-6. That is, areas of the gate electrodes G, G1, and G2 may be greater or smaller than or the same as those of the semiconductor layers 10 and 10-1 through 10-6.

Figure 6:
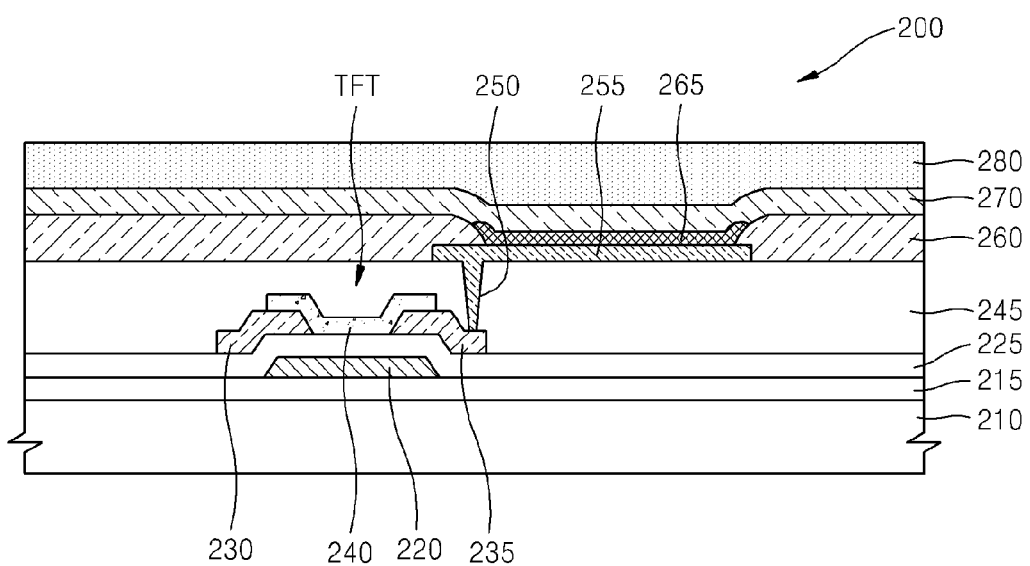
FIG. 6 is a cross-sectional view of an organic light-emitting display device according to an embodiment of the present invention.

FIG. 6 is a cross-sectional view of an organic light-emitting display device 200 according to an embodiment of the present invention.

The organic light-emitting display device 200 according to an embodiment of the present invention may include the semiconductor layers 10 and 10-1 through 10-6 or the thin film semiconductor devices 100a through 100g of FIGS. 1 through 5G. FIG. 6 exemplary shows a cross section of the organic light-emitting display device 200 employing the thin film semiconductor device 100d of FIG. 5D. However, this is exemplary and various modifications may be possible.

Referring to FIG. 6, the organic light-emitting display device 200 includes a thin film transistor TFT and an intermediate layer 265 including an organic emission layer disposed between a bottom electrode 255 and a top electrode 270.

A buffer layer 215 may be disposed on a substrate 210 to prevent impurities from introducing from the substrate 210. The substrate 210 may be formed of glass, silicon, plastic, or metal and may be a flexible substrate.

An electrode material layer may be formed on the buffer layer 215. A gate electrode 220 may be formed on the buffer layer 215 by patterning the gate electrode material layer. The gate electrode 220 may be formed of metal such as MoW, Al, Cr, and Al/Cr or conductive polymer. For example, the gate electrode 220 may be formed of a conductive material such as silver nano wire, carbon nano tube, graphene, and ITO. The gate electrode 220 may be a transparent electrode and elongatable.

A gate insulation layer 225 may be stacked on a front surface of the substrate 210 to cover the gate electrode 220. For example, the gate insulation layer 225 may be formed of an inorganic insulation material such as oxide, nitride, oxynitride, or a combination of these. For example, the gate insulation layer 225 may be formed of an organic insulation material such as benzocyclobutene (BCB), polyimide, polyvinylphenol, parylene, epoxy, and poly vinyl chloride.

An electrode material layer may be stacked on the front surface of the substrate 210 to cover the gate insulation layer 225. The electrode material layer may be patterned with the source electrode SE and the drain electrode DE of one of FIGS. 2A through 4C. As shown in FIG. 6, a source electrode 230 and a drain electrode 235 may be formed on the gate insulation layer 225, and the gate electrode 220 may be disposed below a space between the source electrode 230 and the drain electrode 235.

The source electrode 230 and the drain electrode 235 may be formed of metal such as molybdenum (Mo), chrome (Cr), tungsten (W), aluminum-neodymium (Al—Nd), titanium (Ti), molybdenum tungsten (MoW), and aluminum (Al). The source electrode 230 and the drain electrode 235 may be formed of conductive polymer. For example, the source electrode 230 and the drain electrode 235 may be formed of the conductive material such as silver nano wire, carbon nano tube, graphene, and ITO, and may be transparent or elongatable.

A semiconductor layer 240 may be disposed between the source electrode 230 and the drain electrode 235 and formed on the gate electrode 220. The semiconductor layer 240 may over the source electrode 230 and the drain electrode 235. The semiconductor layer 240 includes a channel region in which a channel is formed when the thin film transistor TFT operates. The channel region is a part of the semiconductor layer 240 between the source electrode 230 and the drain electrode 235.

The semiconductor layer 240 may be an element semiconductor layer, a compound semiconductor layer, or an organic semiconductor layer. An interlayer insulation layer 245 may be disposed on the front surface of the substrate 210 in which the semiconductor layer 240 is formed. The interlayer insulation layer 245 may include an inorganic insulation material or an organic insulation material. The interlayer insulation layer 245 may protect the thin film transistor TFT.

A contact plug 250 that passes through the interlayer insulation layer 245 may be used to form the bottom electrode 255 connected to the drain electrode 235 on the interlayer insulation layer 245. Although the bottom electrode 255 is connected to the drain electrode 235 in FIG. 6, this is exemplary. The bottom electrode 255 may be a transparent electrode or a reflective electrode.

The bottom electrode 255 may be a transparent electrode or a reflective electrode. When the bottom electrode 255 is formed as a transparent electrode, the bottom electrode 255 may include ITO, IZO, ZnO, or $In_2O_3$. Also, when the bottom electrode 255 is formed as a reflective electrode, the bottom electrode 255 may have a multi-stack structure including a first layer that is formed of Ag, Mg, Al, Pt, Pd, Au, Ni, Nd, Ir, Cr, or compound of any of these, and a second layer that is formed on the first layer and that includes ITO, IZO, ZnO, or $In_2O_3$.

A pixel-defining layer (PDL) 260 that defines a pixel by exposing a part of the bottom electrode 255 may be disposed on the interlayer insulation layer 245. The intermediate layer 265, including an EML, may be formed on the bottom electrode 255 that is exposed through pixel-defining layer (PDL) 260.

The top electrode 270 may be stacked on an entire surface of the substrate 210. In this regard, the top electrode 270 may be formed as a transparent electrode or a reflective electrode. When the top electrode 270 is formed as a transparent electrode, the top electrode 270 may include a first layer that is formed of Li, Ca, LiF/Ca, LiF/Al, Al, Mg, or a compound of any of these, and a second layer that is formed on the first layer and that includes ITO, IZO, ZnO, or $In_2O_3$. In this regard, the second layer may be formed as an auxiliary electrode or a bus electrode line. When the top electrode 270 is formed as a reflective electrode, the aforementioned Li, Ca, LiF/Ca, LiF/Al, Al, Mg, or a compound of any of these is completely deposited.

The intermediate layer 265 that is interposed between the bottom electrode 255 and the top electrode 270 may include a small molecule organic material or a polymer organic material.

When the intermediate layer 265 includes a small molecule organic material, the intermediate layer 265 may have a structure in which a hole injection layer (HIL), a hole transport layer (HTL), an emission layer (EML), an electron transport layer (ETL), and an electron injection layer (EIL) are singularly or multiply stacked.

Also, the intermediate layer 265 may be formed of various organic materials including copper phthalocyanine (CuPc), N,N'-Di(naphthalene-1-yl)-N,N'-diphenyl-benzidine (NPB), tris-8-hydroxyquinoline aluminum)(Alq3), or the like, by a vacuum deposition method using masks.

When the intermediate layer 265 includes a polymer organic material, the intermediate layer 265 may have a structure of an HTL and an EML, and in this regard, the HTL may be formed of poly(3,4-ethylenedioxythiophene) (PEDOT), and the EML may be formed of a poly-phenylenevinylene (PPV)-based material or a polyfluorene-based material.

An encapsulation layer 280 may be formed on the top electrode 270. The encapsulation layer 280 may have a structure in which an inorganic layer or an inorganic layer and organic layer are alternatively stacked.

If a flexible device is rolled or folded in a direction, a tensile force is generated in the rolled or folded direction, whereas, according to the one or more embodiments of the present invention, a channel length increases in the rolled or folded direction and a channel length in a direction perpendicular to the rolled or folded direction decreases, thereby constantly maintaining an average channel length. Thus, although the flexible device is rolled or folded in a direction, an electrical characteristic of a TFT may be constantly maintained.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film semiconductor device, comprising:
a flexible elongatable substrate, the substrate being elongatable in a first direction and the substrate being elongatable in a second direction perpendicular to the first direction, the flexible elongatable substrate being comprised of a plastic material; and
a thin film transistor (TFT) disposed on the substrate and comprising a flexible semiconductor layer comprising a source region, a drain region and a channel region arranged between the source region and the drain region, wherein a channel length being a distance between the source region and the drain region,
wherein a part of the source region is spaced apart from the drain region and partially surrounds the drain region, and
wherein a part of the drain region is spaced apart from the source region and partially surrounds the source region, wherein the channel region comprises a plurality of first portions having channel lengths extending perpendicular to the first direction and a plurality of second portions having channel lengths extending perpendicular to the second direction, wherein an area occupied by the first portions and an area occupied by the second portions are adjusted so that an average channel length of the thin film transistor remains unchanged upon the thin film semiconductor device being rolled, folded or subjected to tensile forces.

2. The thin film semiconductor device of claim 1, wherein the source region, the drain region and the channel region each have spiral shapes, the source and drain regions being regions of the semiconductor layer that have a higher doping concentration than other areas of the semiconductor layer.

3. The thin film semiconductor device of claim 1, wherein the source region and the drain region have line shapes each comprising a first edge closer to a center of the TFT and a second edge farther from the center of the TFT, respectively, and each comprising a first arc portion closer to the first edge and having a first curvature radius and a second arc portion closer to the second edge and having a second curvature radius greater than the first curvature radius, respectively, the source region and the drain region have 180 degree rotational and symmetrical relationship with respect to a center point of the semiconductor layer.

4. The thin film semiconductor device of claim 3, wherein the source region and the drain region each comprise a first rectilinear portion extending from the first edge to one end of the first arc portion and a second rectilinear portion extending from another end of the first arc portion to an opposite direction to a direction in which the first rectilinear portion extends and having the same length as the first rectilinear portion, respectively,
wherein the second rectilinear portion of the source region, the first rectilinear portion of the drain region, the first rectilinear portion of the source region, and the second rectilinear portion of the drain region are sequentially and equally spaced apart from each other.

5. The thin film semiconductor device of claim 1, wherein the source region, the drain region and the channel region each have rectangular spiral shapes.

6. The thin film semiconductor device of claim 1, wherein the source region and the drain region have line shapes each comprising a first edge closer to a center of the TFT and a second edge farther from the center of the TFT, respectively, and each comprising a first portion extending from the first edge, a second portion connected to the first portion and extending in a direction perpendicular to a direction in which the first portion extends, a third portion connected to the second portion and extending in an opposite to the direction in which the first portion extends, and a fourth portion connected to the third portion and extending in an opposite to a direction in which the second portion extends, respectively, wherein lengths of the first and third portions are adjusted so that an average channel length does not change upon the thin film semiconductor device being rolled, folded or subjected to tensile forces.

7. The thin film semiconductor device of claim 1, wherein the channel region has a channel width defined along a direction perpendicular to the channel length, and wherein the channel lengths are uniform in a direction of the channel width.

8. The thin film semiconductor device of claim 1, the semiconductor layer being elongatable,
such that when the substrate is elongated in the first direction, the channel lengths of the plurality of first portions of the channel region decrease, and the channel lengths of the plurality of second portions of the channel region increase, the source, drain and channel regions being designed such that the increases in the channel lengths balance out the decreases in the channel lengths, and
such that when the substrate is elongated in the second direction, the channel lengths of the plurality of second portions of the channel region decrease, and the channel lengths of the plurality of first portions of the channel region increase, the source, drain and channel regions being designed such that the increases in the channel lengths balance out the decreases in the channel lengths.

9. The thin film semiconductor device of claim 1, wherein the TFT further comprises a bottom gate electrode disposed between the substrate and the channel region of the semiconductor layer and a top gate electrode disposed on the channel region of the semiconductor layer, wherein when the thin film semiconductor device is rolled, folded or subjected to tensile forces, any change in a distance between the top gate electrode and the semiconductor layer is offset by a commensurate change in distance between the bottom gate electrode and the semiconductor layer.

10. An organic light-emitting display device, comprising:
a flexibly extendable substrate, the substrate being extendable in a first direction and the substrate being extendable in a second direction perpendicular to the first direction, the flexibly extendable substrate being comprised of a plastic material;
a flexibly extendable thin film transistor (TFT) disposed on the substrate and comprising a semiconductor layer comprising a source region, a drain region and a channel region between the source and drain regions, the channel region having a channel length being a distance between the source region and the drain region at a particular location on the channel region, the source and drain regions having spiral shapes;
a bottom electrode electrically connected to the TFT;
a top electrode provided on the bottom electrode; and
an emission layer (EML) disposed between the bottom electrode and the top electrode and comprising an organic emission layer, wherein the channel region comprises a plurality of first portions having channel lengths extending perpendicular to the first direction and a plurality of second portions having channel lengths extending perpendicular to the second direction, wherein an area occupied by the first portions and an area occupied by the second portions are adjusted so that an average channel length of the thin film transistor remains unchanged upon the thin film semiconductor device being rolled, folded or subjected to tensile forces.

11. The organic light-emitting display device of claim 10, wherein a part of the source region is spaced apart from the drain region and partially surrounds the drain region, and
wherein a part of the drain region is spaced apart from the source region and partially surrounds the source region, the source and drain regions each having a higher impurity concentration than the channel region.

12. The organic light-emitting display device of claim 10, wherein the source region and the drain region have 180 degree rotational and symmetrical relationship with respect to a center point of the semiconductor layer.

13. A thin film semiconductor device, comprising:
a flexible elongatable substrate extending in a first direction and a second direction perpendicular to the first direction, the flexible elongatable substrate being comprised of a plastic material;
a flexible semiconductor layer disposed on the flexible elongatable substrate, comprising first and second surfaces facing each other, and a channel region;
a source electrode and a drain electrode provided on the first surface or the second surface of the semiconductor layer and disposed at both sides of the channel region along the channel region of the semiconductor layer at locations corresponding to the source and drain regions respectively of the semiconductor layer;
a first gate electrode provided on the first surface of the semiconductor layer, spaced apart from the semiconductor layer and overlapping with at least a part of the semiconductor layer; and
a second gate electrode provided on second surface of the semiconductor layer, spaced apart from the semiconductor layer and overlapping with at least a part of the semiconductor layer,
wherein the channel region comprises a channel length defined as a distance between the source region and the drain region, a plurality of first portions having channel lengths perpendicular to the first direction, and a plurality of second portions having channel lengths in a direction perpendicular to the second direction, wherein when the thin film semiconductor device is rolled, folded or subjected to tensile forces, the source, drain and channel regions of the semiconductor layer are designed so that a channel length change within the second portions offsets a channel length change within the first portions.

14. The thin film semiconductor device of claim 13,
wherein when the flexible elongatable substrate is elongated in the first direction, the channel lengths of the plurality of first portions of the channel region decrease, and the channel lengths of the plurality of second portions of the channel region increase a corresponding amount, and
wherein when the flexible elongatable substrate is elongated in the second direction, the channel lengths of the plurality of second portions of the channel region decrease, and the channel lengths of the plurality of first portions of the channel region increase a corresponding amount so that the electrical characteristics of the thin film transistor remain unchanged.

15. The thin film semiconductor device of claim 13, wherein when the flexible elongatable substrate is elongated, a change rate of size of the semiconductor layer according to an elongation direction is higher than that of an average channel length of the channel region.

16. The thin film semiconductor device of claim 13, wherein the source region and the drain region have line shapes each comprising a first edge closer to a center of the TFT and a second edge farther from the center of the TFT, respectively, and each comprising a first portion extending from the first edge, a second portion connected to the first portion and extending in a direction perpendicular to a direction in which the first portion extends, a third portion connected to the second portion and extending in an opposite to the direction in which the first portion extends, and a fourth portion connected to the third portion and extending in an opposite to a direction in which the second portion extends, respectively, wherein lengths of the first and third portions are adjusted so that an average channel length does not change upon thin film semiconductor device being rolled, folded or subjected to tensile forces.

17. The thin film semiconductor device of claim 3, wherein a radius of curvature of the second arc portion being two times a radius of curvature of the first arc portion.

18. The thin film semiconductor device of claim 13, wherein when the thin film semiconductor device is rolled, folded or subjected to tensile forces, any change in a distance between the first gate electrode on the first surface and the semiconductor layer is offset by a commensurate change in distance between the second gate electrode on the second surface and the semiconductor layer.

19. The thin film semiconductor device of claim 9, wherein the bottom gate electrode and the top gate electrode are electrically connected to each other and have a same electric potential.

20. The thin film semiconductor device of claim 13, wherein the first gate electrode and the second gate electrode are electrically connected to each other and have a same electric potential.

* * * * *